United States Patent
Wintz et al.

(10) Patent No.: US 12,387,172 B2
(45) Date of Patent: Aug. 12, 2025

(54) SYSTEM AND METHODS FOR DETERMINING PICK AISLE ARRANGEMENTS

(71) Applicant: Lineage Logistics, LLC, Irvine, CA (US)

(72) Inventors: Daniel Thomas Wintz, San Francisco, CA (US); Daniël Walet, Oakland, CA (US); Jacob Edward Thompson, Atlanta, GA (US); Elias MacGregor Mills, Brookhaven, GA (US); Natalie Novitzky, San Francisco, CA (US); Thomas Eugene Murphy, San Francisco, CA (US)

(73) Assignee: Lineage Logistics, LLC, Irvine, CA (US)

( * ) Notice: Subject to any disclaimer, the term of this patent is extended or adjusted under 35 U.S.C. 154(b) by 207 days.

(21) Appl. No.: 18/096,870

(22) Filed: Jan. 13, 2023

(65) Prior Publication Data
US 2023/0222439 A1   Jul. 13, 2023

Related U.S. Application Data

(60) Provisional application No. 63/299,362, filed on Jan. 13, 2022.

(51) Int. Cl.
G06Q 10/087   (2023.01)
B65G 1/137    (2006.01)
G06F 30/13    (2020.01)

(52) U.S. Cl.
CPC ......... *G06Q 10/087* (2013.01); *B65G 1/1371* (2013.01); *G06F 30/13* (2020.01)

(58) Field of Classification Search
CPC ...... G06Q 10/087; G06Q 10/08; G06Q 10/06; B65G 1/1371; G06F 30/13
See application file for complete search history.

(56) References Cited

U.S. PATENT DOCUMENTS

| | | |
|---|---|---|
| 7,072,902 B2 | 7/2006 | Kleinberger et al. |
| 9,733,633 B2 | 8/2017 | Wickham et al. |

(Continued)

FOREIGN PATENT DOCUMENTS

| | | |
|---|---|---|
| CN | 106241168 | 12/2016 |
| CN | 108292381 | 7/2018 |

(Continued)

OTHER PUBLICATIONS

Ariyanti et al., "The integrated method of warehouse layout and labor scheduling to reduce overtime", Proceeding of the International Conference on Industrial Engineering and Operations Management Bandung, 2008-2014, 2018.

(Continued)

*Primary Examiner* — A. Hunter Wilder
(74) *Attorney, Agent, or Firm* — Barnes & Thornburg LLP

(57) ABSTRACT

Disclosed are systems and methods for determining a pick area arrangement for a storage facility. A method can include retrieving, by a computer system, historic pallet information for pallet SKUs and pick area information, determining, based on the information, a number of bays to allocate for each pallet SKU, determining, based on the information, a number of dynamic bays to allocate in the pick area, which receive pallet SKUs in high demand during a particular time, determining, based on the information, quantities of aisles to allocate as pick aisles in the pick area by simulating aisle arrangements with pallet SKUs from the historic pallet information and determining average travel times to complete pick orders having the pallet SKUs in the aisle arrangements, selecting the quantity of aisles providing a lowest average travel time, and assigning each pallet SKU from the historic pallet information to bays in the quantity of aisles.

20 Claims, 20 Drawing Sheets

(56) References Cited

U.S. PATENT DOCUMENTS

| | | |
|---|---|---|
| 10,489,802 B1 | 11/2019 | Zhdanov et al. |
| 10,504,061 B1 | 12/2019 | Shi |
| 10,796,278 B1 | 10/2020 | Wintz et al. |
| 10,956,858 B2 | 3/2021 | Jahani |
| 11,113,648 B2 | 9/2021 | Willard, III et al. |
| 11,195,129 B2 | 12/2021 | Willard, III et al. |
| 11,436,560 B2 | 9/2022 | Wintz et al. |
| 11,629,009 B2 | 4/2023 | Eil |
| 2005/0229819 A1 | 10/2005 | Hollander et al. |
| 2008/0133310 A1 | 6/2008 | Kim et al. |
| 2009/0082902 A1 | 3/2009 | Foltz et al. |
| 2009/0125385 A1 | 5/2009 | Landvater |
| 2010/0138274 A1 | 6/2010 | Bateni et al. |
| 2010/0164191 A1 | 7/2010 | Kinnen et al. |
| 2013/0166350 A1 | 6/2013 | Willemain et al. |
| 2013/0226649 A1 | 8/2013 | Grissom |
| 2014/0040075 A1 | 2/2014 | Perry et al. |
| 2014/0343713 A1 | 11/2014 | Ziegler et al. |
| 2017/0091349 A1 | 3/2017 | Rm |
| 2017/0091704 A1 | 3/2017 | Wolf et al. |
| 2018/0068255 A1 | 3/2018 | Hance et al. |
| 2019/0213530 A1 | 7/2019 | Wolf et al. |
| 2020/0034780 A1 | 1/2020 | Sikka et al. |
| 2021/0150461 A1 | 5/2021 | Wintz et al. |
| 2021/0150473 A1 | 5/2021 | Wintz et al. |
| 2022/0366362 A1 | 11/2022 | Wintz et al. |

FOREIGN PATENT DOCUMENTS

| | | |
|---|---|---|
| CN | 109154799 | 1/2019 |
| CN | 110059992 | 7/2019 |
| WO | WO 2021/102111 | 5/2021 |

OTHER PUBLICATIONS

Bae, et al., "Acoustic scene classification using parallel combination of lstm and cnn," Proceedings of the Detection and Classification of Acoustic Scenes and Events 2016 Workshop (DCASE2106), 2016, pp. 11-15.

Chen, et al., "Sequencing the storages and retrievals for flow-rack automated storage and retrieval systems with duration-of-stay storage policy," International Journal of Production Research, 2016, 54(4):984-998.

Chen, et al., "The storage location assignment and interleaving problem in an automated storage/retrieval system with shared storage," International Journal of Production Research, 2010, 48(4):991-1011.

Cho, et al., Learning phrase representations using RNN encoder-decoder for statistical machine translation, CoRR/ abs/1406.1078, 2014, 15 pages.

Chung, et al., "Empirical evaluation of gated recurrent neural networks on sequence modeling," arXiv preprint arXiv:1412.3555, 2014, 9 pages.

Donahue, et al., "Long-term recurrent convolutional networks for visual recognition and description," CoRR, abs/1411.4389, 2014, 14 pages.

Dos Santos and Gatti, "Deep convolutional neural networks for sentiment analysis of short texts," Proceedings of COLING 2014, the 25th International Conference on Computational Linguistics: Technical Papers, 2014, pp. 69-78.

Goetschalckx and Ratliff, "Shared storage policies based on the duration stay of unit loads," Management Science, 1990, 36(9):1120-1132.

Hausman, et al., "Optimal storage assignment in automatic warehousing systems," Management Science, 1976, 22 (6):629-638.

He, et al., Deep residual learning for image recognition, CoRR, abs/1512.03385, 2015, 12 pages.

International Preliminary Report on Patentability in International Appln. No. PCT/US2020/061235, dated Jun. 2, 2022, 9 pages.

International Search Report and Written Opinion in International Application No. PCT/US2020/061235, dated Mar. 2, 2021.

Jaderberg, et al., "Reading text in the wild with convolutional neural networks," International Journal of Computer Vision, 2016, 116(1):1-20.

Johnson and Zhang, "Effective use of word order for text categorization with convolutional neural networks," arXiv preprint arXiv:1412.1058, 2014, 10 pages.

Johnson and Zhang, "Supervised and semi-supervised text categorization using lstm for region embeddings," arXiv preprint arXiv:1602.02373, 2016, 9 pages.

Kingma and Ba, "Adam: A method for stochastic optimization," arXiv preprint arXiv:1412.6980, 2014, 15 pages.

Kulturel, et al., "Experimental investigation of shared storage assignment policies in automated storage/retrieval systems," IIE Transactions, 1999, 31(8):739-749.

Li et al., "Dynamic storage assignment with product affinity and ABC classification-a case study", The International Journal of Advanced Manufacturing Technology 84(9): 2179-2194, 2015.

Malmborg, "Interleaving models for the analysis of twin shuttle automated storage and retrieval systems," International Journal of Production Research, 2000, 38(18):4599-4610.

Muppani and Adil, "Efficient formation of storage classes for warehouse storage location assignment: A simulated annealing approach," Omega, 2008, 36(4):609-618, Special Issue on Logistics: New Perspectives and Challenges.

Pennington, et al., "Glove: Global vectors for word representation," Empirical Methods in Natural Language Processing (EMNLP), 2014, pp. 1532-1543.

Petersen, et al., "Improving order-picking performance through the implementation of class-based storage," International Journal of Physical Distribution & Logistics Management, 2004, 34(7):534-544.

Rosenblatt and Eynan, "Note-deriving the optimal boundaries for class-based automatic storage-retrieval systems," Management Science, 1989, 35(12):1519-1524.

Schuster and Paliwal, "Bidirectional recurrent neural networks," IEEE Transactions on Signal Processing, 1997, 45 (11):2673-2681.

Schwarz, et al., "Scheduling policies for automatic warehousing systems: Simulation results," AIIE Transactions, 1978, 10(3):260-270.

Srivastava, et al., "Dropout: a simple way to prevent neural networks from overfitting," The Journal of Machine Learning Research, 2014, 15(1):1929-1958.

Sutskever, et al., Generating text with recurrent neural networks, Proceedings of the 28th International Conference on Machine Learning (ICML-11), 2011, pp. 1017-1024.

Wang, et al., "End-to-end text recognition with convolutional neural networks," 21st International Conference on Pattern Recognition (ICPR), 2012, IEEE, 3304-3308.

Yu and Koster, "Designing an optimal turnover-based storage rack for a 3d compact automated storage/retrieval system," International Journal of Production Research, 2009, 47(6):1551-1571.

Yu and Koster, "On the suboptimality of full turnover-based storage," International Journal of Production Research, 2013, 51(6):1635-1647.

Yu, et al., "Class-based storage with a finite number of items: Using more classes is not always better," Production and Operations Management, 2015, 24(8):1235-1247.

Zhou, et al., "Text classification improved by integrating bidirectional lstm with two-dimensional max pooling," arXiv preprint arXiv:1611.06639, 2016, 11 pages.

Accorsi et al., "A decision-support system for the design and management of warehousing systems", Computers in Industry 65 (2014): 175-186.

International Search Report and Written Opinion in International Application No. PCT/US2023/010827, dated Apr. 14, 2023.

Historic Pallet Information 301

| SKU | Description | Avg Daily Pallet Pick | Max Daily Pallet Picks | # of Bays to Avoid Midshift Drop | Weight/ Pallet |
|---|---|---|---|---|---|
| A | Yogurt | 4.5 | 10 | 6 | 80 |
| B | Ice cream | 2 | 7 | 4 | 50 |
| C | Eggs | 7 | 16 | 8 | 80 |
| D | Chicken | 4.5 | 9 | 5 | 100 |

Sorted by Velocity 302

| SKU | Description | Avg Daily Pallet Pick | Max Daily Pallet Picks | # of Bays to Avoid Midshift Drop | Weight/ Pallet |
|---|---|---|---|---|---|
| C | Eggs | 7 | 16 | 8 | 80 |
| A | Yogurt | 4.5 | 10 | 6 | 80 |
| D | Chicken | 4.5 | 9 | 5 | 100 |
| B | Ice Cream | 2 | 7 | 4 | 50 |

Sorted by Weight 304

| SKU | Description | Avg Daily Pallet Pick | Max Daily Pallet Picks | # of Bays to Avoid Midshift Drop | Weight/ Pallet |
|---|---|---|---|---|---|
| C | Eggs | 7 | 16 | 8 | 80 |
| D | Chicken | 4.5 | 9 | 5 | 100 |
| A | Yogurt | 4.5 | 10 | 6 | 80 |
| B | Ice Cream | 2 | 7 | 4 | 50 |

Probabilities Information 506

| SKU | Pallet | Probability |
|---|---|---|
| A | 1 | 90% (27/30) |
| A | 2 | 73% (22/30) |
| A | 3 | 40% (12/30) |
| A | 4 | 6% (2/30) |
| B | 1 | 100% (26/26) |
| B | 2 | 88% (23/26) |
| B | 3 | 69% (18/26) |
| B | 4 | 42% (11/26) |

Rank 508

Ranked Probabilities Information 510

| SKU | Pallet | Probability |
|---|---|---|
| B | 1 | 100% |
| A | 1 | 90% |
| B | 2 | 88% |
| A | 2 | 73% |
| B | 3 | 69% |
| B | 4 | 42% |
| A | 3 | 40% |
| A | 4 | 6% |

FIG. 5B

Suggested Pick Aisle Arrangement 512
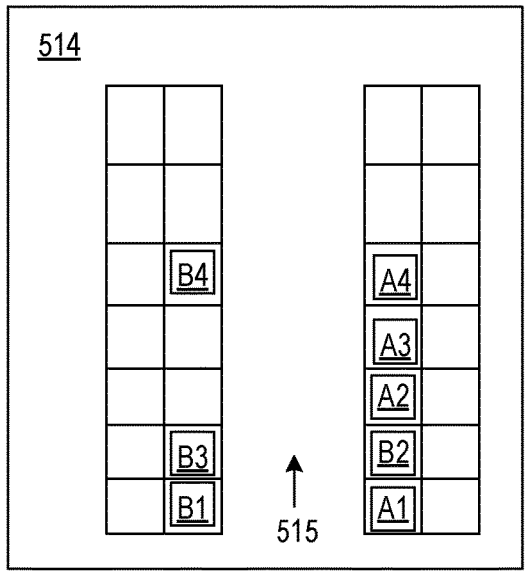
Suggested Pick Aisle Arrangement 516
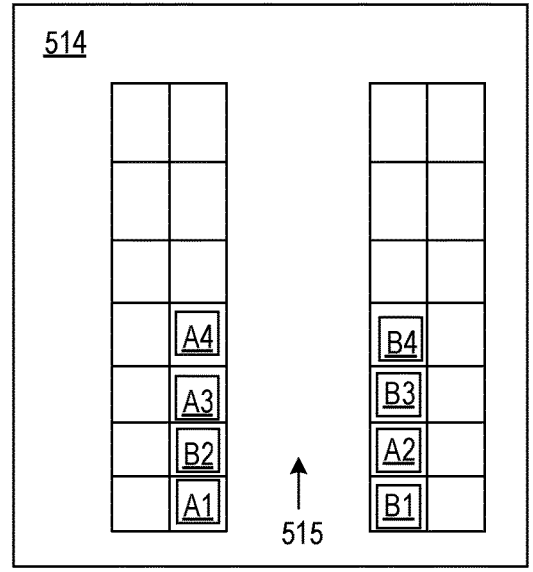
Suggested Pick Aisle Arrangement 518
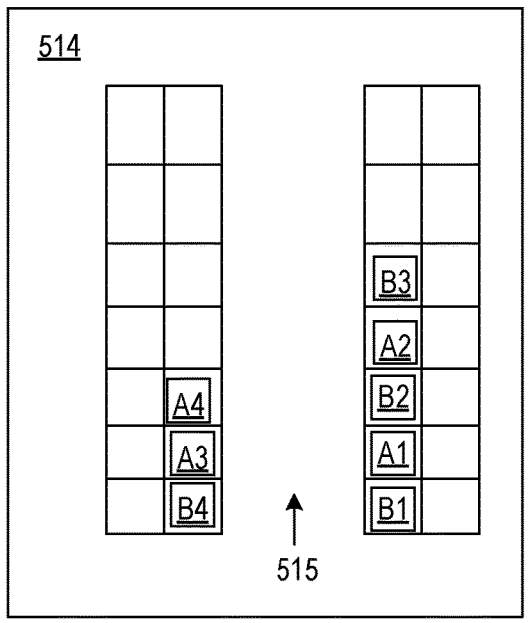
Suggested Pick Aisle Arrangement 520
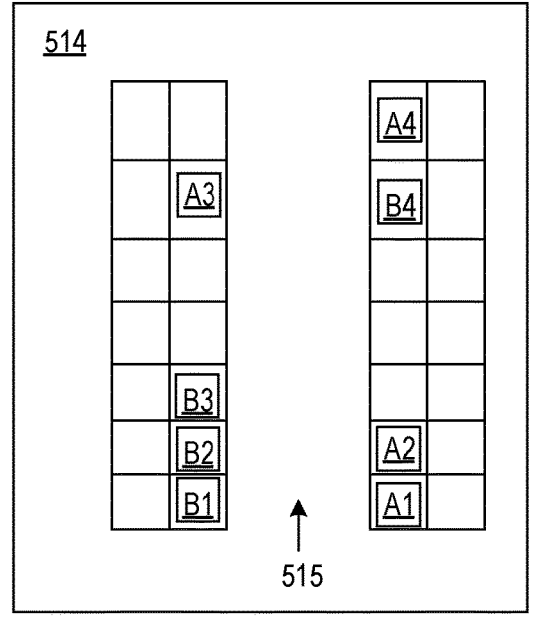
FIG. 5C

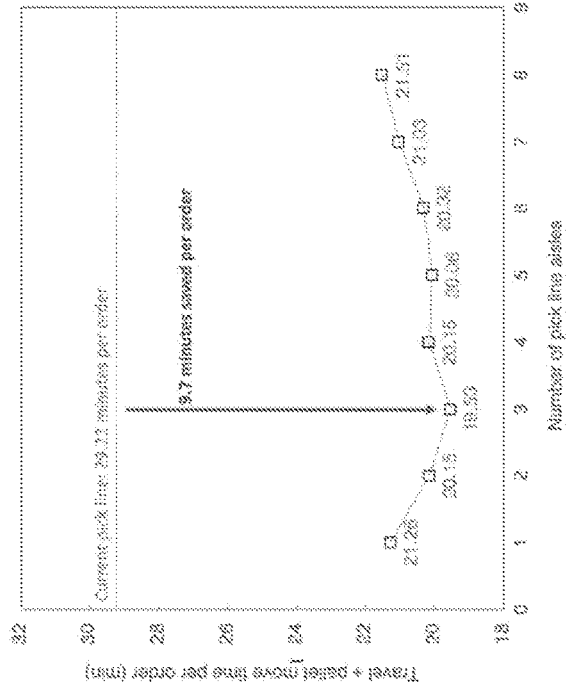
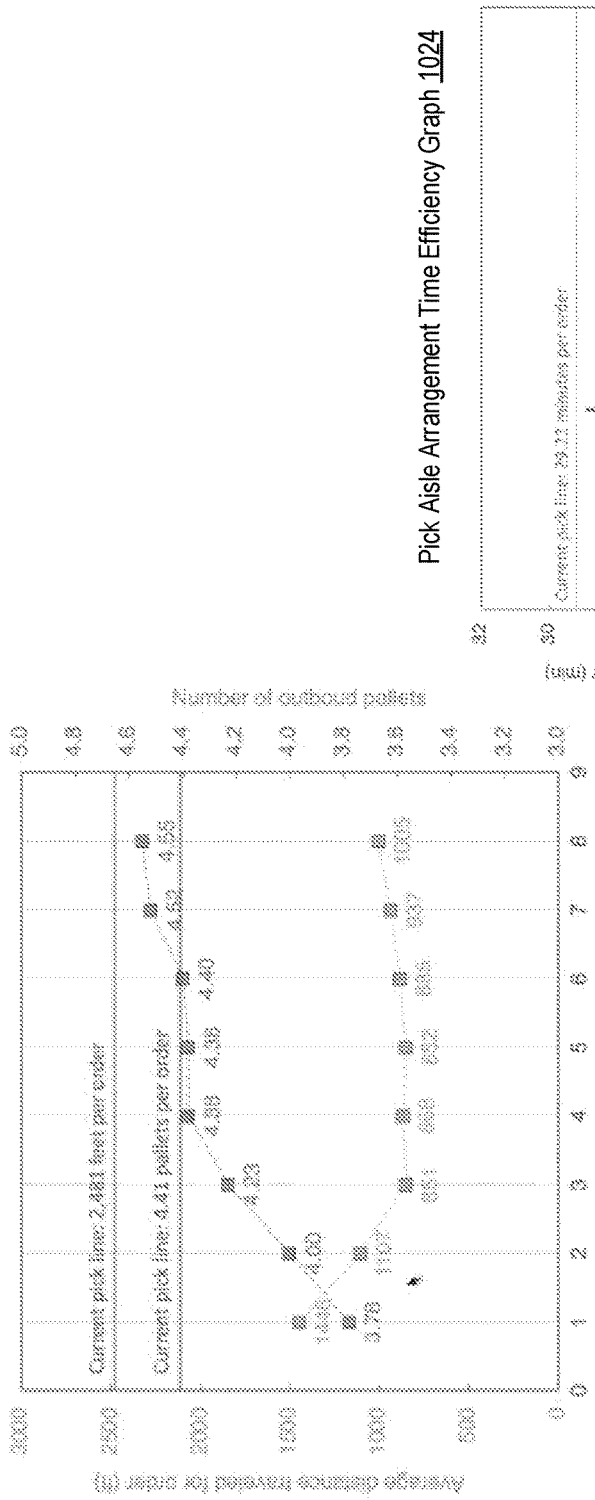
FIG. 10D

SYSTEM AND METHODS FOR DETERMINING PICK AISLE ARRANGEMENTS

CROSS-REFERENCE TO RELATED APPLICATIONS

This application claims priority to U.S. Provisional Patent Application No. 63/299,362, filed on Jan. 13, 2022, which is hereby incorporated by reference in its entirety.

TECHNICAL FIELD

This document generally describes devices, systems, and methods related to determining pick aisle arrangements in a warehouse environment.

BACKGROUND

Warehouse or other storage facilities receive physical items to be stored for an amount of time before being routed out of the warehouse. The physical items can include pallets, cases, and other items that can be stored before being requested by a customer. The physical items can be stored for different periods of time and under different storage conditions, which can be based on a vendor, customer, or other relevant information. Items can be stored until they are requested to be distributed from a warehouse, for example, to another facility where the items will be used, sold, or otherwise consumed. Oftentimes pallets are received and stored at a warehouse containing a group of goods or items that are of the same type. A customer can, for example, items of a same type and/or items of different types be distributed and shipped from a warehouse. Requests for combinations of items of different types can cause a pick order to be generated and for case picking to be performed. When the customer requests items in a pick order request, the customer can also indicate quantities of each item that are being requested.

When the pick order request is received at the warehouse, warehouse workers can work to fulfill that request. For example, the warehouse workers can determine an order to pick the requested items. Sometimes, the pick order can be random. Sometimes, the pick order can be based on locations of the items relative to each other in the warehouse. Sometimes, the warehouse workers can pick the items from various different locations in the warehouse. The can be a time and energy consuming task.

Sometimes, the warehouse workers can move items to be picked for multiple pick order requests into a pick area. The warehouse workers can then pick items for a particular pick order request from within the pick area. The items in the pick area may not be arranged in any particular order or location. As a result, it can take the warehouse workers more time and energy to locate items to be picked in the pick area and to navigate the pick area to complete collecting the items and building a pick pallet for the particular pick order request.

SUMMARY

The document generally relates to systems and methods for determining optimal pick aisle arrangements in a warehouse (e.g., storage facility). The disclosed technology can be used to determine how to arrange pallets (e.g., items) in one or more pick aisles in a pick area in order to fulfill pick orders efficiently. Determining the optimal pick aisle arrangements can vary per warehouse and can be based on a variety of factors. The factors can include but are not limited to frequency that certain pallets are picked (e.g., velocity), weight per pallet, item type of the pallet, whether pallets can crush other pallets of items when stacked on a pick pallet (e.g., outbound pallet), and/or seasonal changes in demand for certain items on the pallets.

The pick aisle arrangements can be determined based on historic pallet information. The disclosed technology can look back over one or more time periods to determine what pallets are frequently picked to determine what pallets are likely to be requested and picked during one or more future time periods. Quantity of pallets that are requested can fluctuate over time and can fluctuate based on seasonal conditions or other factors. Demand for some items on pallets, such as ice cream, can increase during summer months while demand for other items, such as Christmas decorations, can decrease during the summer months. With ever-changing topography in demand, the disclosed technology can be used to determine what pallets are likely to be the most requested during a certain time period and how to design pick aisle arrangements to meet such changes in demand. For example, to meet such changes in demand, the disclosed technology can allocate a quantity of dynamic bays to the pick area that can be filled with pallets that are in high demand at a current time.

In some implementations, the pick aisle arrangements can be determined based on historic pallet velocity and/or weight. For example, pallets that are frequently picked to fulfill pick order requests (e.g., higher velocity) can be placed closer to a front of one or more pick aisles in the pick area. Warehouse workers may then travel less distance to complete pick order requests that contain the frequently picked pallets. As another example, heavy pallets can be placed closer to a front of one or more pick aisles. Placing the heavy pallets closer to a back of the one or more pick aisles, on the other hand, can cause the warehouse workers to consume more energy and time to move the heavy pallets towards the front of the pick aisles when completing pick order requests. Therefore, the heavy pallets can be placed closer to the front of the pick aisles such that the warehouse workers can travel less distance with the heavy pallets to complete the pick order requests, thereby improving overall efficiency and energy consumption.

In some implementations, the disclosed technology can provide for determining a number of pick locations, or bays, on the pick aisles to assign to each pallet based on historical picking data associated with that pallet. Pallets that are more frequently picked on average per day can be allocated more bays in the pick area than pallets that are less frequently picked on average per day. Moreover, the disclosed technology can also provide for determining whether to group bays per pallet and/or to separate the bays per pallet. Grouping bays per pallet can be based on probabilities that the pallets will be picked over some time period. In some implementations, where large volumes of a particular pallet are requested in pick orders, it can be preferred to group the bays for that particular pallet. In some implementations, where smaller volumes of the particular pallet are requested in pick orders, it can be preferred to separate the bays for that particular pallet throughout the pick area. Determining whether to group bays per pallet can also be based on impacts that grouped bays may have on efficiency to pick other pallets in pick order requests.

The disclosed technology can also provide for determining a number of locations or bays on the pick aisle that can be designated as dynamic pick locations. The dynamic pick locations can then be filled with pallets that, on a daily basis, may fluctuate in quantity based on changes in real-time demand. For example, pallets that are in high demand on a particular day can be slotted in the dynamic pick locations for that day. Therefore, the dynamic pick locations can be used to handle large volumes of pallets on some days. The dynamic pick locations can be advantageous to help move volumes of pallets more efficiently.

The disclosed technology can also provide for determining how many aisles to allocate in the pick area. This allocation can be based on historic pallet information. The disclosed technology can provide for simulating pick area arrangements having different numbers of aisles. The disclosed technology can determine projected travel times to complete pick order requests in each of the simulated pick area arrangements. The projected travel times can include time needed to travel to each bay to pick pallets in the pick order requests and time needed to build pallet(s) to complete the pick order request. The pick area arrangement having a lowest aggregate travel time can be selected as the optimal pick area arrangement. In some implementations, 3 aisles can be preferred and most optimal in comparison to 1 aisle or 8 aisles. 1 aisle, for example, can require warehouse workers to travel longer longitudinal distances with more pallets in order to pick all the pallets for the pick order requests in the aisle. Similarly, 8 aisles can require warehouse workers to travel longer lateral distances with more pallets in order to pick all the pallets for the pick order requests that may be dispersed across so many aisles. Thus, a 3 aisle arrangement can be preferred in some implementations for providing less travel distance to pick all pallets for pick order requests.

One or more embodiments described herein include a method for determining a pick area arrangement for a storage facility, the method can include: retrieving, by a computer system from a data store, (i) historic pallet information for a plurality of pallet SKUs and (ii) pick area information, the historic pallet information including, for each of the pallet SKUs, an average daily pallet pick, a maximum daily pallet pick, and a weight per pallet, and the pick area information includes a current layout of the pick area, determining, by the computer system and based on the historic pallet information, a number of bays to allocate for each of the pallet SKUs, determining, by the computer system and based on the historic pallet information and the pick area information, a number of dynamic bays to allocate in the pick area, the dynamic bays being configured to receive pallet SKUs that may be in high demand during a particular time period, determining, by the computer system and based on historic pallet information and the pick area information, one or more quantities of aisles to allocate as pick aisles in the pick area, in which determining the quantities of aisles to allocate can be based on simulating one or more aisle arrangements with pallet SKUs from the historic pallet information and determining average travel times to complete pick orders having the pallet SKUs in each of the one or more aisle arrangements, selecting, by the computer system, the quantity of aisles that provides a lowest average travel time, assigning, by the computer system, each of the pallet SKUs from the historic pallet information to bays in the selected quantity of aisles in the pick area based on the determined number of bays allocated for each of the pallet SKUs, the determined number of dynamic bays allocated in the pick area, the average daily pallet pick for each of the pallet SKUs, and the weight per pallet of each of the pallet SKUs, and outputting, by the computer system, pick area arrangement information. The pick area arrangement information can include at least one of the quantity of aisles that can provide the lowest average travel time, the assignments of each of the pallet SKUs to the bays in the selected quantity of aisles, the determined number of bays allocated for each of the pallet SKUs, and the determined number of dynamic bays allocated in the pick area.

In some implementations, the system can optionally include one or more of the following features. For example, determining, by the computer system and based on the historic pallet information, a number of bays to allocate for each of the pallet SKUs can include ranking, based on the historic pallet information, a number of pallets picked per day into a historic spread for the pallet SKU, retrieving, from a data store, a threshold number of days that is acceptable for a mid shift drop of any pallet SKU in the historic pallet information, comparing the threshold number of days to the historic spread for the pallet SKU, and selecting the number of bays to allocate based on the comparison of the threshold number of days to the historic spread for the pallet SKU. Sometimes, the threshold number of days that is acceptable for a mid shift drop of any pallet SKU can be 15 days. The selected number of bays to allocate can be greater than the average daily pallet pick and less than the maximum daily pallet pick for the pallet SKU.

As another example, assigning, by the computer system, each of the pallet SKUs from the historic pallet information to bays in the selected quantity of aisles in the pick area can include identifying a velocity of each of the pallet SKUs, the velocity being a frequency at which each of the pallet SKUs is picked on a daily basis, ranking, into a list, the pallet SKUs from highest to lowest velocity, selecting a first pallet SKU having a same velocity as a second pallet SKU, determining whether the weight per pallet of the first pallet SKU is less than the weight per pallet of the second pallet SKU, swapping rankings of the first pallet SKU and the second pallet SKU based on determining that the weight per pallet of the first pallet SKU is less than the weight per pallet of the second pallet SKU, keeping rankings of the first pallet SKU and the second pallet SKU based on determining that the weight per pallet of the first pallet SKU is more than the weight per pallet of the second pallet SKU, outputting the ranked list, assigning pallet SKUs at a top of the list to bays in the selected quantity of aisles that are closest to a front of the pick area, and assigning pallet SKUs at a bottom of the list to bays in the selected quantity of aisles that are farthest from the front of the pick area. Sometimes, the velocity can be the average daily pallet pick for each of the pallet SKUs.

As another example, assigning, by the computer system, each of the pallet SKUs from the historic pallet information to bays in the selected quantity of aisles in the pick area can include determining whether to group the bays for each of the pallet SKUs. Determining, by the computer system, whether to group the bays for each of the pallet SKUs can include identifying the number of bays to allocate for the pallet SKU, determining a number of days that each of the number of bays would be picked, determining a probability of getting picked per SKU based on the number of bays allocated and the number of days the bays would be picked, and grouping the number of bays based on determining that the probability of a next pallet of the pallet SKU getting picked is within a threshold range. The method can also include separating the number of bays based on determining that the probability of the next pallet of the pallet SKU getting picked exceeds the threshold range. The probability of getting picked per SKU can be a percentage value and the threshold range is 10%.

In some implementations, determining, by the computer system and based on the historic pallet information, a number of dynamic bays to allocate in the pick area can include randomly determining one or more quantities of dynamic bays to allocate in the pick area, for each of the quantities of dynamic bays, interspersing the number of dynamic bays throughout the pick area in one or more pick area arrangements, receiving (i) a list of pallet SKUs that can be placed in the number of dynamic bays and (ii) a picking order for the list of pallet SKUs, simulating placement, based on (ii), of the pallet SKUs from the list into one or more of the number of dynamic bays in the pick area arrangements, simulating distance traveled to complete the picking order for the list of pallet SKUs in each of the pick area arrangements, determining a number of pallets to build to complete the picking order for the list of pallet SKUs in each of the pick area arrangements, determining an aggregate amount of time to complete the picking order for the list of pallet SKUs for each of the pick area arrangements based on the simulated distance traveled and the determined number of pallets to build, selecting the pick area arrangement having a lowest aggregate amount of time to complete the picking order for the list of pallet SKUs, and returning the number of dynamic bays associated with the selected pick area arrangement.

Moreover, determining, by the computer system and based on historic pallet information and the pick area information, one or more quantities of aisles to allocate as pick aisles in the pick area further can include: determining one or more aisle arrangements having different quantities of aisles, assigning pallet SKUs from the historic pallet information to bays in each of the aisle arrangements, the assignments being made based on velocity, receiving pick sequences for one or more pick orders, simulating distance traveled to complete the pick sequences for the one or more pick orders in each of the aisle arrangements, determining a number of pallets to build to complete the pick sequences for the one or more pick orders in each of the aisle arrangements, determining an aggregate amount of time to complete the one or more pick orders based on the simulated distance traveled and the determined number of pallets to build, selecting the aisle arrangement having a lowest aggregate amount of time to complete the one or more pick orders, and returning the selected aisle arrangement.

One or more embodiments described herein can include a system for determining a pick area arrangement for a storage facility, the system including a pick area having bays and a computer system. The computer system can retrieve, from a data store, (i) historic pallet information for a plurality of pallet SKUs and (ii) pick area information, the historic pallet information including, for each of the pallet SKUs, an average daily pallet pick, a maximum daily pallet pick, and a weight per pallet, and the pick area information includes a current layout of the pick area, determine, based on the historic pallet information, a number of bays to allocate for each of the pallet SKUs in the pick area, determine, based on the historic pallet information and the pick area information, a number of dynamic bays to allocate in the pick area, the dynamic bays being configured to receive pallet SKUs that are in high demand during a particular time period, determine, based on historic pallet information and the pick area information, one or more quantities of aisles to allocate as pick aisles in the pick area, in which determining the quantities of aisles to allocate can be based on simulating one or more aisle arrangements with pallet SKUs from the historic pallet information and determining average travel times to complete pick orders having the pallet SKUs in each of the one or more aisle arrangements, select the quantity of aisles that provides a lowest average travel time, assign each of the pallet SKUs from the historic pallet information to bays in the selected quantity of aisles in the pick area based on the determined number of bays allocated for each of the pallet SKUs, the determined number of dynamic bays allocated in the pick area, the average daily pallet pick for each of the pallet SKUs, and the weight per pallet of each of the pallet SKUs, and output pick area arrangement information, the pick area arrangement information including at least one of the quantity of aisles that provides the lowest average travel time, the assignments of each of the pallet SKUs to the bays in the selected quantity of aisles, the determined number of bays allocated for each of the pallet SKUs, and the determined number of dynamic bays allocated in the pick area.

In some implementations, the system can optionally include one or more of the following features. For example, the computer system can be configured to determine, based on the historic pallet information, a number of bays to allocate for each of the pallet SKUs further based on: ranking, based on the historic pallet information, a number of pallets picked per day into a historic spread for the pallet SKU, retrieving, from a data store, a threshold number of days that is acceptable for a mid shift drop of any pallet SKU in the historic pallet information, comparing the threshold number of days to the historic spread for the pallet SKU, and selecting the number of bays to allocate based on the comparison of the threshold number of days to the historic spread for the pallet SKU. Threshold number of days that can be acceptable for a mid shift drop of any pallet SKU can be 15 days. The selected number of bays to allocate can be greater than the average daily pallet pick and less than the maximum daily pallet pick for the pallet SKU.

In some implementations, the computer system can be configured to assign each of the pallet SKUs from the historic pallet information to bays in the selected quantity of aisles in the pick area based on: identifying a velocity of each of the pallet SKUs, the velocity being a frequency at which each of the pallet SKUs is picked on a daily basis, ranking, into a list, the pallet SKUs from highest to lowest velocity, selecting a first pallet SKU having a same velocity as a second pallet SKU, determining whether the weight per pallet of the first pallet SKU is less than the weight per pallet of the second pallet SKU, swapping rankings of the first pallet SKU and the second pallet SKU based on determining that the weight per pallet of the first pallet SKU is less than the weight per pallet of the second pallet SKU, keeping rankings of the first pallet SKU and the second pallet SKU based on determining that the weight per pallet of the first pallet SKU is more than the weight per pallet of the second pallet SKU, outputting the ranked list, assigning pallet SKUs at a top of the list to bays in the selected quantity of aisles that are closest to a front of the pick area, and assigning pallet SKUs at a bottom of the list to bays in the selected quantity of aisles that are farthest from the front of the pick area. Moreover, the velocity can be the average daily pallet pick for each of the pallet SKUs. The computer system can also assign each of the pallet SKUs from the historic pallet information to bays in the selected quantity of aisles in the pick area based on determining whether to group the bays for each of the pallet SKUs. Moreover, the computer system can be configured to determine whether to group the bays for each of the pallet SKUs based on: identifying the number of bays to allocate for the pallet SKU, determining a number of days that each of the number of bays would be picked, determining a probability of getting picked per SKU based on the number of bays allocated and the number of days the bays would be picked, and grouping the number of bays based on determining that the probability of a next pallet of the pallet SKU getting picked is within a threshold range.

The devices, system, and techniques described herein may provide one or more of the following advantages. For example, the disclosed technology provides for more efficient use of computing resources. The disclosed technology can be faster and lighter to process and execute based on using a variety of factors associated with historic pallet pick information. Moreover, using the historic pallet pick information can be advantageous to more insightfully and efficiently allocate pick aisles and locations or bays in the pick aisles. The disclosed technology provides for determining pick aisle arrangements that work well and may be more efficient than other pick aisle arrangements.

The disclosed technology can provide for having multiple pallets of a same item on the pick aisle for high velocity items (e.g., grouping bays per pallet). This can be advantageous to reduce or otherwise avoid time delays that may occur when having to wait to replenish high velocity pallets in the pick area. Therefore, high velocity pallets may be continuously slotted on the pick aisle so that the high velocity pallets can be picked more quickly and efficiently when requested on a daily basis. Moreover, grouping high velocity pallets on the pick aisles can be advantageous because it can allow for warehouse workers to spend less time and energy collecting a necessary quantity of the pallets to fulfill the pick order requests.

Moreover, the disclosed technology can be used to minimize a number of pick aisles in the pick aisle arrangement as well as a size of the pick aisles while also improving efficiency in picking all pallets to complete pick order requests on time. This can be advantageous to reduce travel distances and times to pick pallets for the pick order requests. The more pick aisles in a pick area and/or the longer the pick aisle, the less efficiently the warehouse workers may complete pick order requests. After all, the warehouse workers would have to travel greater distances with more pallets, which can weigh more, than if the pallets are consolidated into fewer pick aisles and/or shorter pick aisles. Thus, an optimal number of pick aisles and size of the pick aisles can be determined based on historic pallet pick information and simulation of possible pick aisle arrangements. Minimizing the number and size of the pick aisles can also be advantageous to increase an amount of space in the warehouse that can be used for storing items. Space efficiency of the warehouse can thereby be improved.

The disclosed technology can also provide for slotting pallets in the pick aisle in such a way that can improve ways to efficiency build pallets for picking. As mentioned above, pallets to be picked can be slotted in pick locations based on velocity and/or weight. The pallets can also be slotted in pick locations based on whether the pallets, when stacked on top of other pallets in an outbound pallet build sequence, may crush or otherwise damage other pallets. As an example, a pick pallet can be built from a back to a front of the pick aisle. A heavy pallet may be placed closer to a middle of the pick aisle instead of the front of the pick aisle because the heavy pallet may crush one or more other pallets if the other pallets are stacked beneath the heavy pallet. However, if the heavy pallet is placed at the back of the pick aisle, then the warehouse worker may consume more energy and time moving the heavy pallet from the back all the way to the front of the pick aisle. Therefore, it can be desirable to slot the heavy pallet on the pick aisle where it is least likely to (i) cause damage to other pallets when stacked on the pick pallet and (ii) cause significant consumption of the warehouse worker's time and energy resources.

As another example, the disclosed technology can provide for placing as many different pallets as possible on the pick aisle in order to avoid cherry picking. This can be advantageous to reduce a possibility that warehouse workers may have to go into storage locations in the warehouse to select odd quantities of pallets or pallets that are less frequently picked for the pick order requests. How many different pallets are slotted for the pick area can be dependent on seasonal changes and one or more other factors. For example, during summer months, the disclosed technology can slot many different beach-type products in the pick area but may also allot few bays in the pick area for back to school or Halloween products. Based on analysis of historic trends, the disclosed technology can determine that there is a fair likelihood that some back to school or Halloween products will be requested during the summer months. Therefore, to avoid time and energy delays that may arise from cherry picking, the disclosed technology can provide for slotting some back to school and/or Halloween products in the pick area during the summer months.

As yet another example, the disclosed technology can provide for minimizing overall travel time for warehouse workers to complete pick order requests. This can be achieved based on determining an optimal number of pick aisles, size of the pick aisles, arrangement or placement of pallets in locations on the pick aisles, and grouping of pallets on the pick aisles. As a result, the disclosed technology can provide for balancing multiple factors that include reducing travel time to pick pallets, ordering pallets in the aisles in such a way that may avoid causing damage to other pick pallets in a pick order request, and ordering the pallets in a way that allows for stable pick pallet build determinations to be made.

The details of one or more implementations are set forth in the accompanying drawings and the description below. Other features and advantages will be apparent from the description and drawings, and from the claims.

BRIEF DESCRIPTION OF THE DRAWINGS

FIG. 3 depicts a process for sorting historic pallet information.

FIG. 5B depicts a process for allocating the pallets per SKU in FIG. 5A based on probability of the pallets being picked.

FIG. 5C depicts example pick aisle arrangements based on probability of each of the pallets of FIG. 5B being picked.

FIG. 10D is a graphical depiction of efficiency associated with different pick aisle arrangements.

Like reference symbols in the various drawings indicate like elements.

DETAILED DESCRIPTION OF ILLUSTRATIVE EMBODIMENTS

This document relates to determining optimal pick aisle arrangements for a warehouse (e.g., storage facility). Determining the optimal pick aisle arrangements can include determining a number of pick aisles, a size of the pick aisles, ordering and positioning of pallets on the pick aisles, a number of bays per pallet, whether to group bays per pallet, a number and position of dynamic bays in the pick area, and/or a number and position of static bays in the pick area.

Figure 1:
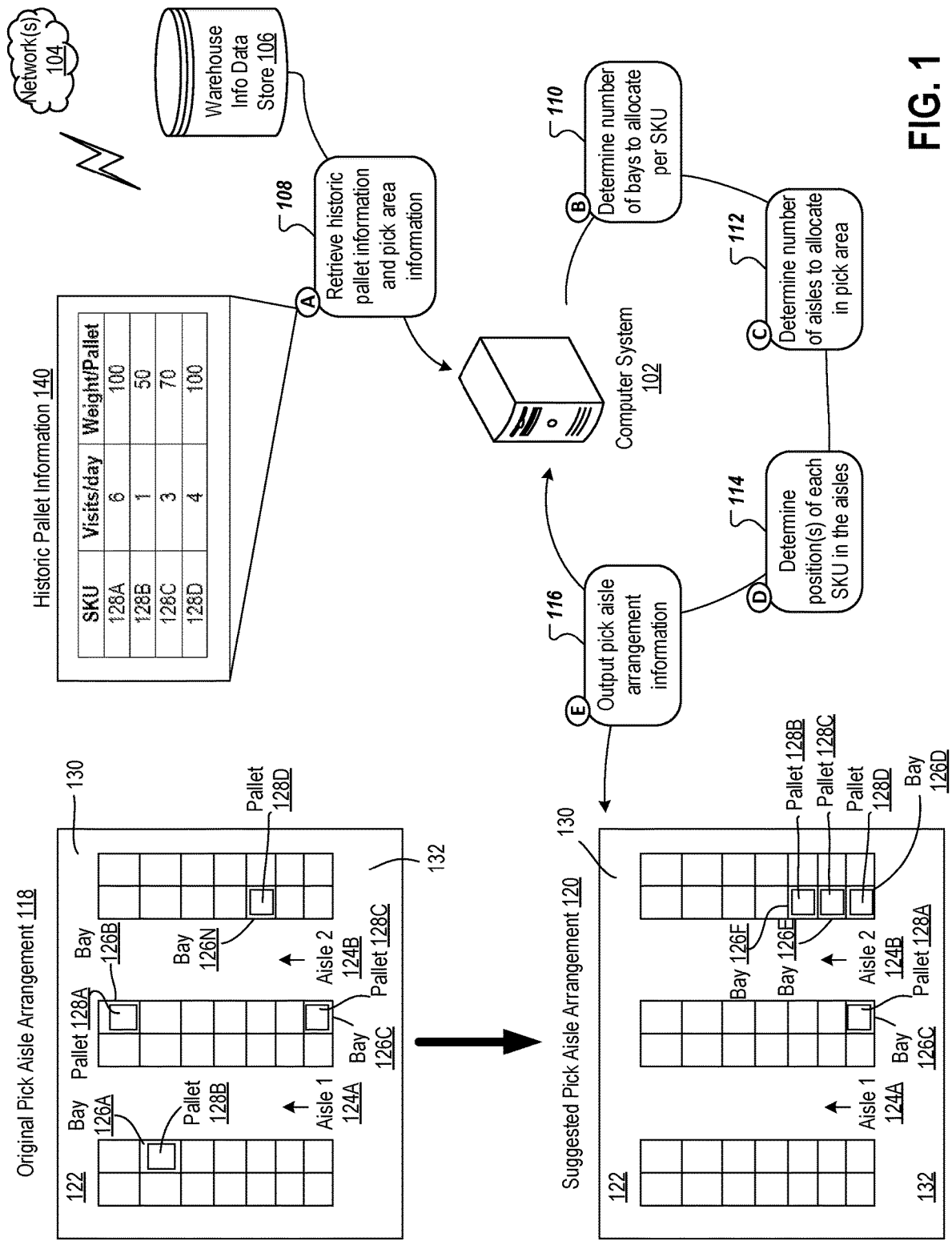
FIG. 1 is a conceptual diagram for determining a pick aisle arrangement for a warehouse.

Referring to the figures, FIG. 1 is a conceptual diagram for determining a pick aisle arrangement for a warehouse. The warehouse can include a pick area 122, which can be a designated room or location in the warehouse. Pallets, which can contain cases of items to be picked for one or more pick order requests, can be stored in the pick area 122. The pick area 122 can be stocked with quantities of each of the pallets based on their SKU that will be or can be picked to fulfill one or more pick order requests. The warehouse can include multiple other rooms and/or locations, such as storage locations, where pallets can be stored until they are requested in pick orders. Warehouse workers, such as human workers, forklifts, autonomous vehicles, or other types of mechanical devices can move items around the warehouse. For example, the warehouse workers can move pallets from a docking bay, where the pallets can be unloaded from trucks. The warehouse workers can then move the pallets into storage locations in the warehouse. The warehouse workers can also move the pallets to the pick area 122, where one or more warehouse workers can pick the pallets to build pick pallets (e.g., outbound pallets) that fulfill pick order requests.

A computer system 102 can be configured to determine one or more pick aisle arrangements for the pick area 122 of a warehouse. The computer system 102 can also communicate with one or more other devices and data stores via network(s) 104. For example, the computer system 102 can determine an optimal pick aisle arrangement for the pick area 122 of the warehouse and transmit the arrangement to a user device. The user device can be used by a warehouse worker, such as a warehouse facility manager, in order to arrange pick aisles in the pick area 122 as described further herein.

The computer system 102 can retrieve historic pallet information and pick area information (step A, 108). This information can be retrieved from a warehouse information data store 106. Retrieved historic pallet information 140 can include information such as a pallet SKU, average picks per day, maximum pick per day, and weight per pallet. The historic pallet information 140 can include one or more additional data about pallets that are stored and moved throughout the warehouse. The historic pallet information 140 can also include information about pallets over one or multiple timeframes. For example, in some implementations, the historic pallet information 140 used to determine pick aisle arrangements can track pallets over 1 month, 60 days, 90 days, 180 days, 365 days, etc. The historic pallet information 140 can also track pallets over one or more seasons, such as summer and winter, quarters, and/or holidays. Looking back over one or more different time periods can be advantageous to project movement and demand of pallets during future time periods. Based on the projected future movement and demand, the computer system 102 can more appropriately allocate dynamic bays, groupings of bays per pallet, and quantity of bays per pallet to improve overall efficiency.

The example historic pallet information 140 in FIG. 1 includes information for pallets having SKUs 128A-D. SKU 128A has 6 visits or picks per day on average and 1 pallet of SKU 128A weighs 100 lb. SKU 128B has 1 visit or pick per day on average and 1 pallet of SKU 128B weighs 50 lb. SKU 128C has 3 visits or picks per day on average and 1 pallet of SKU 128C weighs 70 lb. Finally, SKU 128D has 4 visits or picks per day on average and 1 pallet of SKU 128C weighs 100 lb. Additional information in the historic pallet information 140 can include height and dimensions for each of the pallet SKUs 128A-D. The historic pallet information 140 can also include data on each of the pallet SKUs 128A-D that are placed in one or more pick locations (e.g., bays) in historic or prior pick area 122 arrangements such as pick location name, owner code, and/or item code.

The computer system 102 can use the historic pallet information 140 to determine what pallets should be placed in the pick area 122 and what bays or pick aisle locations to position these pallets. Thus, the computer system 102 can determine optimal placement and positioning of pallets in the pick area 122 to improve efficiency in fulfilling pick order requests.

Moreover, the pick area information can indicate a current or original pick aisle arrangement 118 in the pick area 122. The computer system 102 can use the pick area information to determine what changes to make to the original pick aisle arrangement 118 that may improve efficiency. The pick area information can include one or more maps of the pick area 122, such as the original pick aisle arrangement 118. The pick area information can also include data on various locations, or bays, in the pick area 122, such as location name, location room, location aisle, location bay, location level, location coordinates (x, y, z), location temperature zone, whether the location is in a two-way aisle or a one-way aisle, and/or a set of identifiers (e.g., SKUs) for items currently stored at the location.

As depicted in FIG. 1, the original pick aisle arrangement 118 includes 2 aisles, a first aisle 124A and a second aisle 124B. Each of the aisles 124A-B include a plurality of bays (e.g., pick locations). Each of the bays can store one or more pallets of items to be picked. In some implementations, each bay can store a plurality of pallets containing different items, or otherwise having different pallet SKUs. In some implementations, each bay can store pallets of a same item, or same pallet SKU. Arrangement of the bays can be determined by the computer system 102, as described below.

In the original pick aisle arrangement 118, pallet SKU 128A is stored in a bay 126B at a back 130 of the pick area 122 in the second aisle 124B. Pallet SKU 128B is stored in a bay 126A closer to the back 130 of the pick area 122 in the first aisle 124A. Pallet SKU 128C is stored in a bay 126C at a front 132 of the pick area 122 in the second aisle 124B. Finally, pallet SKU 128D is stored in a bay 126N closer to the front 132 of the pick area 122 in the second aisle 124B. Depending on an order that one or more of the pallet SKUs 128A-D may be picked to fulfill one or more pick order requests, a warehouse worker may spend significant amounts of time and energy picking the pallet SKUs 128A-D in the original pick aisle arrangement 118. For example, pallet SKU 128A weighs 100 lb and is placed in the bay 126B at the back 130 of the pick area 122. When a quantity of the pallet SKU 128A is requested in a pick order, a warehouse worker would have to carry a significant amount of weight, at least 100 lb for 1 pallet, of the pallet SKU 128A from the back 130 of the pick area 122 all the way to the front 132 of the pick area 122. Carrying this amount of weight over long distances can consume more energy, resources, and time. The warehouse worker may therefore be less efficient in completing the pick order request.

Accordingly, the computer system 102 can determine more optimal pick aisle arrangements that can make the warehouse worker and the overall warehouse more efficient in completing pick order requests. A more optimal pick aisle arrangement in this example pick area 122 can include slotting the heavier pallet SKU 128A closer to the front of the pick area 122. As a result, when the pallet SKU 128A is requested, the warehouse worker may travel shorter distances while carrying the pallet SKU 128A, which can reduce an amount of resources and time needed by the warehouse worker to complete the pick order request. Accordingly, the computer system 102 can generate a suggested pick aisle arrangement 120 for the pick area 122 using the techniques described herein.

The computer system 102 can, for example, determine a number of bays to allocate per pallet SKU in the retrieved historic pallet information 140 (step B, 110). The number of bays to allocate can be based on a historic spread of how many of each pallet SKU is picked on a daily basis, as described further in reference to FIGS. 2A-B.

The computer system 102 can also determine a number of aisles to allocate in the pick area 122 (step C, 112). The computer system 102 can simulate a variety of pick aisle arrangements to determine which arrangement involves a smallest amount of travel time and/or distance to complete pick order requests, as described further in reference to FIGS. 10A-D.

Figure 9A:
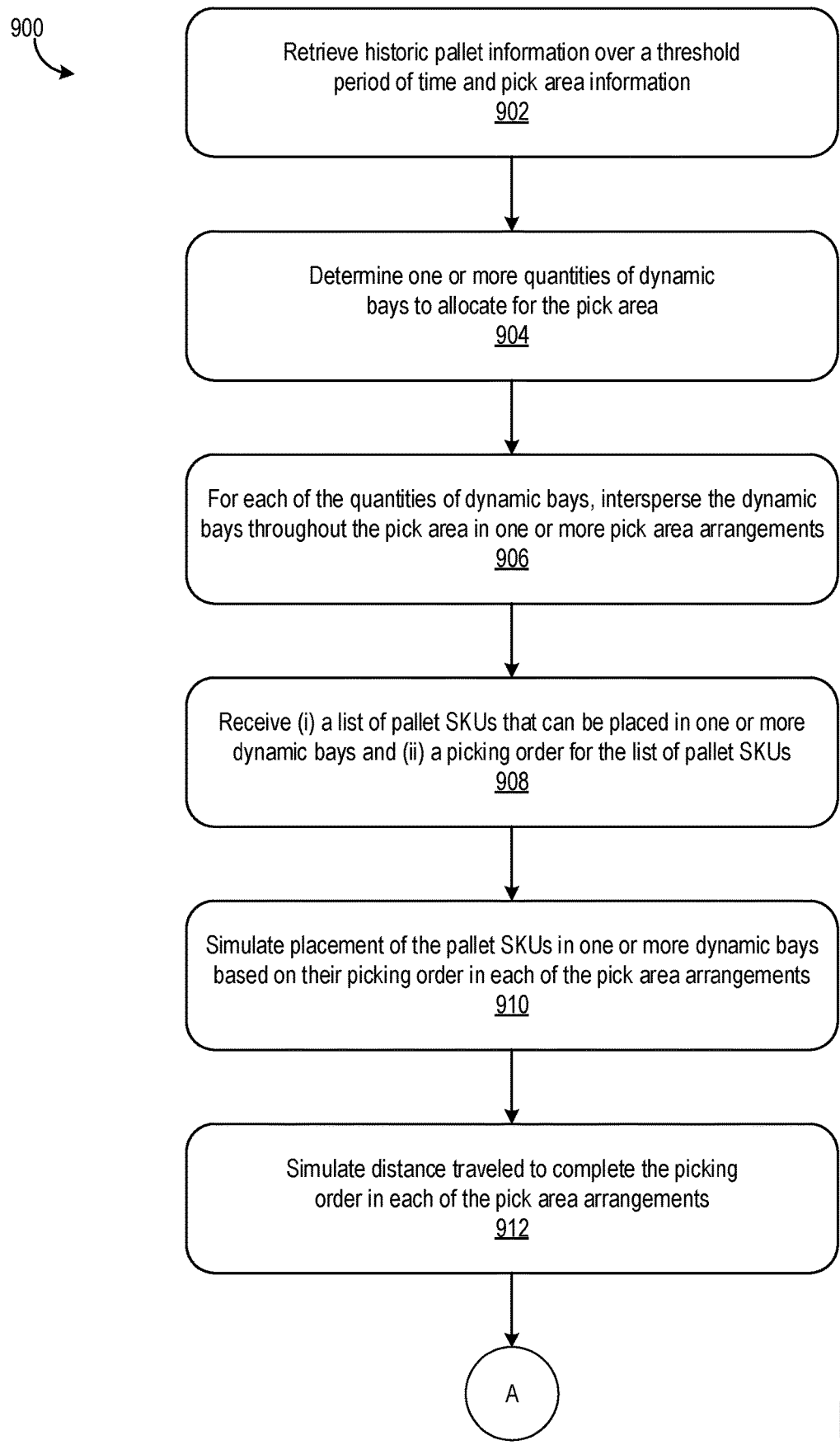
FIGS. 9A-B is a flowchart of a process for determining a quantity of dynamic pick locations to assign in a pick aisle arrangement.
Figure 9B:
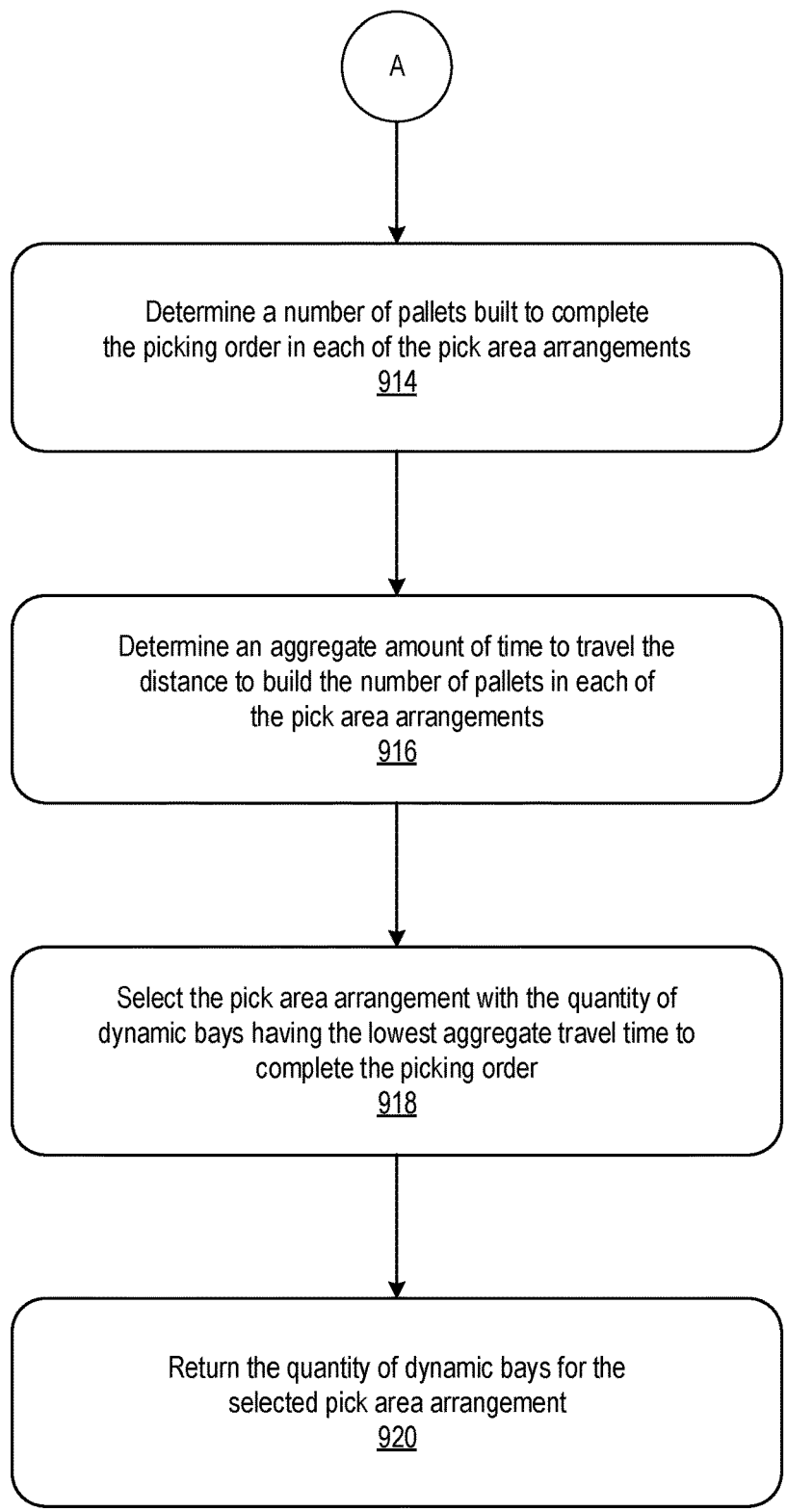

The computer system 102 can also determine a quantity of bays to allocate as static pick locations and dynamic pick locations, as described in reference to FIGS. 9A-B. Identifying a quantity of dynamic pick locations in the pick area 122 can be based on velocity and/or popularity of one or more pallets. For example, the computer system 102 can determine that multiple dynamic pick locations can be reserved for the pick area 122 during a summer season because during the summer season, ice cream is in high demand. The ice cream can then be slotted in the dynamic pick locations in order to make it easier and more efficient for warehouse workers to fulfill pick order requests for the ice cream. During another season, for example, a different high demand item can be stored in the dynamic pick locations and/or a different quantity of dynamic pick locations can be determined for that season.

The computer system 102 can also determine positions of each pallet SKU in the determined number of aisles allocated in the pick area 122 (step D, 114). In other words, the computer system 102 can determine which of the bays 126A-N should receive which of the pallet SKUs 128A-D. This determination can be made based on historic velocity and/or weight of each pallet SKU 128A-D, as described further in reference to FIGS. 3 and 7.

This determination can also include determining whether to group bays per one or more pallet SKUs 128A-D and/or to separate bays of one or more pallet SKUs 128A-D, as described further in reference to FIGS. 5A-C and 8A-B. For example, it can be advantageous to group pallet SKUs having a high historic velocity in bays that are next to each other in order to facilitate more efficient and faster picking of large quantities of such item SKUs.

The computer system 102 can then output the pick aisle arrangement information (step E, 116). As shown in FIG. 1, the outputted information can include the suggested pick aisle arrangement 120. The outputted information can include a map of which aisles are part of the pick aisle arrangement in the pick area 122 and where each of the pallet SKUs 128A-D can be positioned in the suggested pick aisle arrangement 120. Outputting the pick aisle arrangement information can also include storing this information in a data store, such as the warehouse information data store 106. This information can then be used by a warehouse worker, such as a facility manager, to assess how to rearrange or otherwise arrange the pick area 122 at a future time.

Referring to the example of FIG. 1, based on the historic pallet information 140, the computer system 102 determined the suggested pick aisle arrangement 120 to have only the second aisle 124B filled with items to be picked. Moreover, the computer system 102 determined that pallet SKU 128A can be positioned at the front 132 of the pick area 122 in the bay 126C of the second aisle 124B. Pallet SKU 128B can be positioned midway down the second aisle 124B in bay 126F. Pallet SKU 128C can be positioned in bay 126E, next to the pallets of item SKU 128B but closer to the front 132 of the pick area 122. Pallet SKU 128D can be positioned at the front 132 of the pick area 122 in bay 126D of the second aisle 124B.

The suggested pick aisle arrangement 120 can provide for more efficient fulfillment of pick order requests. For example, pallet SKUs 128A and 128D weigh the most, at 100 lb per pallet. Placing the pallet SKUs 128A and 128D at the front 132 of the pick area 122 in the second aisle 124B can be advantageous to reduce distance that warehouse workers would have to travel while carrying such pallets. Reducing the distance can also reduce an amount of time and energy resources consumed to move these heavy pallets. Thus, the pallet SKUs 128A and 128D can be picked up towards the end of fulfilling a pick order request such that the warehouse worker may not have to carry heavy loads over longer distances and/or over longer time periods.

Moreover, although pallet SKU 128B weighs less than pallet SKU 128C, the pallet SKU 128C can be positioned closer to the front 132 of the pick area in the second aisle 124B because the pallet SKU 128C can be picked more frequently than the pallet SKU 128B. In other words, the pallet SKU 128C can have a higher velocity over a predetermined historic timeframe.

Finally, placement of all the pallet SKUs 128A-D in 1 aisle instead of 2 or more can be advantageous in reducing an amount of time needed to travel greater distances. For example, if the pallet SKUs 128A-D were spread out across 4 pick aisles, a warehouse worker may consume significant amounts of time and energy moving between all of the 4 pick aisles in order to pick the necessary pallets to fulfill a pick order request. Moreover, using 4 pick aisles in the pick area 122 can reduce a footprint of the warehouse that can otherwise be used for storing items in storage locations. In the example of FIG. 1, the computer system 102 may determine that 1 aisle is a most efficient arrangement based on a variety of factors, such as only a small quantity of pallets need to be slotted in the pick area 122 and/or an order by which one or more of the pallet SKUs 128A-D may be picked to fulfill a pick order request would not cause traffic or congestion in the second aisle 128A. Also, the smaller footprint for the pick area 122, the more space that is available in the warehouse for storing pallets in storage locations.

Figure 2A:
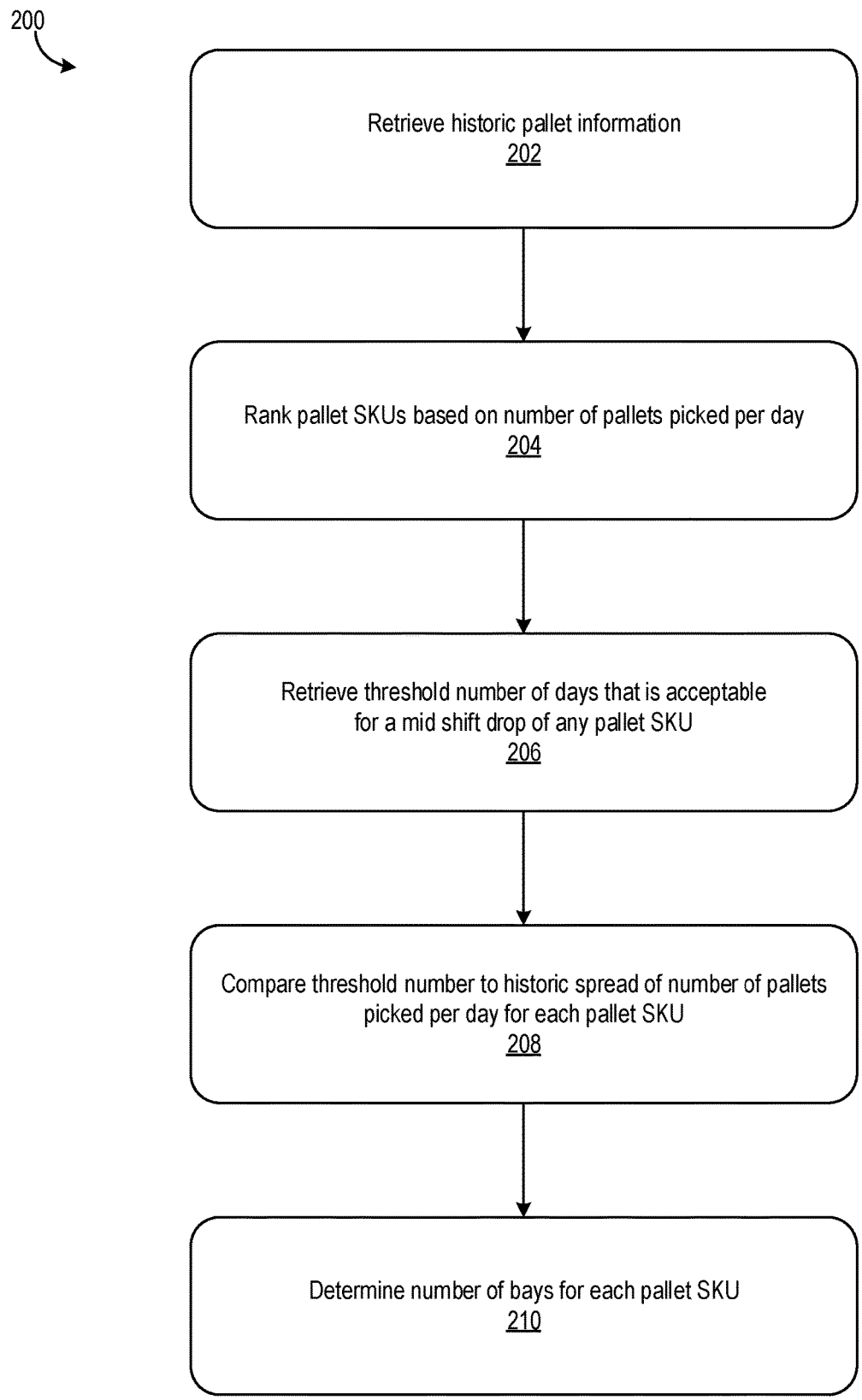
FIG. 2A is a flowchart of a process for determining a number of pick aisle locations, or bays, to assign to a particular pallet.
Figure 2B:
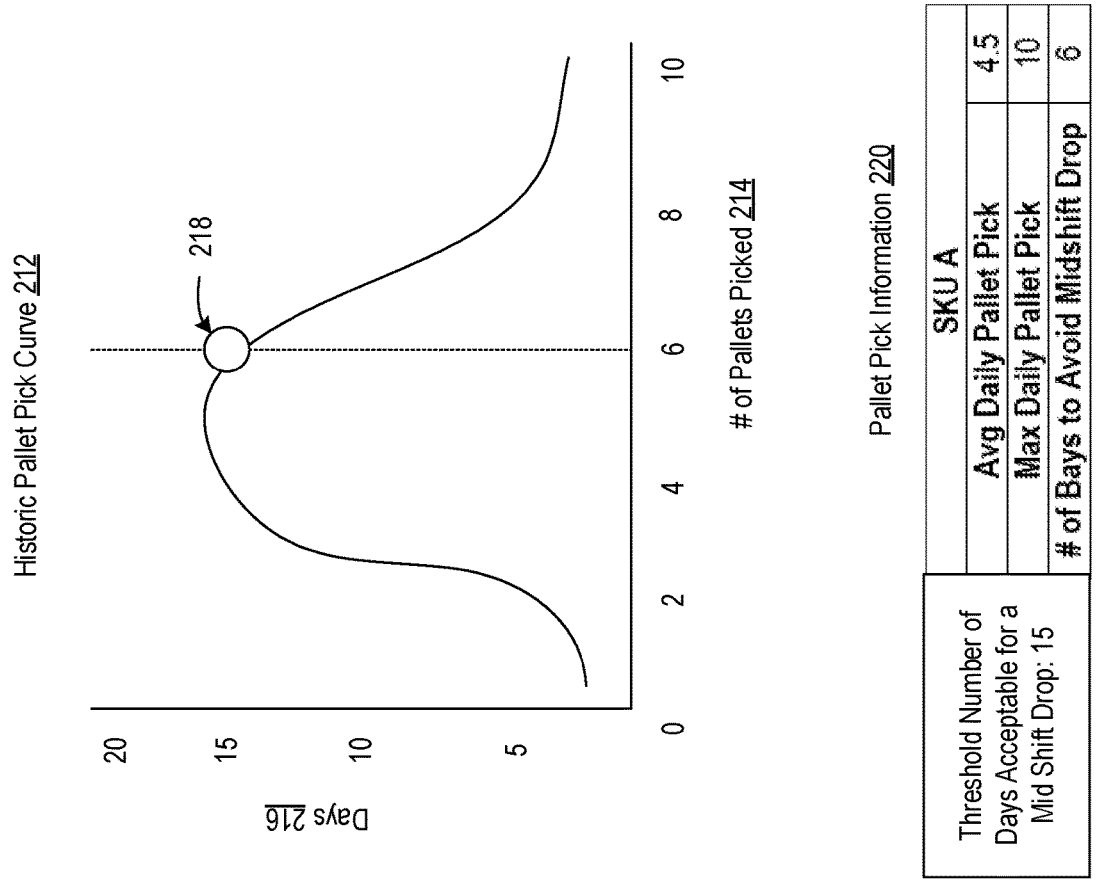
FIG. 2B is an example graphical depiction for determining the number of pick aisle locations to assign to the particular pallet in the process 200 in FIG. 2A.

FIG. 2A is a flowchart of a process 200 for determining a number of pick aisle locations, or bays, to assign to a particular pallet. FIG. 2B is an example graphical depiction for determining the number of pick aisle locations to assign to the particular pallet in the process 200 in FIG. 2A. The pick aisle locations can be bays along the pick aisles. The bays can store multiple pallets of items of a particular SKU and/or a variety of SKUs. Performing the process 200 can be advantageous to determine how many days can be tolerated before a mid shift drop or replenishment is needed for a particular SKU. A number of bays can be allocated based on this tolerance threshold in order to avoid having to replenish pallets while fulfilling a pick order request that includes those pallets. The process 200 can be performed by the computer system 102. The process 200 can also be performed by one or more other computing systems, servers, and/or devices. For illustrative purposes, the process 200 is described from the perspective of a computer system.

Referring to the process 200, the computer system can retrieve historic pallet information in 202. The historic pallet information can correspond to a plurality of different pallet SKUs. The historic pallet information can include, for each pallet SKU, average daily pallet pick and maximum daily pallet pick. Average daily pallet pick can indicate on average, how many of the pallet SKU is picked per day. Maximum daily pallet pick can indicate a greatest amount of the pallet SKU that has been picked over a predetermined time period. In the example of FIG. 2B, the computer system retrieved pallet pick information 220. Here, pallets of SKU A have an average daily pallet pick of 4.5 and a maximum daily pallet pick of 10. This information indicates that, typically, 4 to 5 pallets of SKU A are picked per day and the most number of pallets of SKU A picked in 1 day is 10 pallets.

The computer system can rank pallet SKUs based on a number of pallets picked per day in 204. The pallet SKUs can be ranked from highest number of pallets picked per day to lowest number of pallets picked per day. The pallet SKUs can also be ranked from highest average daily pick to lowest average daily pick. In some implementations, the pallet SKUs can be ranked from lowest number of pallets picked per day to highest number of pallets picked per day, as shown in FIG. 2B.

The computer system can retrieve a threshold number of days that is acceptable for a mid shift drop of any pallet SKU in 206. This information can be retrieved from a data store. This information can also be received from another computing system in the warehouse environment, such as a warehouse management system (WMS). In some implementations, this information can be part of the historic pallet information that is retrieved in 202. The threshold number of days that is acceptable can be the same for pallets of any SKU. This threshold number can be used for the pick area of this warehouse facility, regardless of which pallet SKUs are placed in the pick area. This threshold number can indicate how many days the warehouse can tolerate for a mid shift drop or replenishment of any pallet SKU.

In the example of FIG. 2B, for pallet SKU A, 15 days is the threshold number of days that are acceptable for a mid shift drop. The 15 day threshold indicates that the pick area should be able to support up to 15 days worth of pallet SKU A for picking before pallet SKU A should be replenished in the pick area. Thus, enough of pallet SKU A can be placed in the picking area to complete pick order requests that include pallet SKU A without having to replenish pallet SKU A while in the midst of completing the pick order requests.

Then, the computer system can compare the threshold number to a historic spread of the number of pallets picked per day for each pallet SKU in 208. As shown in FIG. 2B, the number of pallet SKU A picked per day 214 (x axis) can be graphed against a number of days 216 (y axis) that the pallet SKU A is picked in a historic pallet pick curve 212. A bell curve results, with a peak of the bell curve being around the average daily pallet pick for pallet SKU A, which is 4.5 pallets picked. As mentioned above, the threshold number is 15 days. Thus, looking at the historic pallet pick curve 212, the computer system can identify what number of pallets picked 214 corresponds to the 15 day threshold that is acceptable for a mid shift drop. Point 218 on the historic pallet pick curve 212 indicates the number of pallets picked 214 that corresponds to the 15 day threshold. The number of pallets picked at the point 218 is 6.

In 210, the computer system can determine a number of bays for each pallet SKU. The number of bays can be based on selecting a number of pallets picked for the pallet SKU. The computer system can select the number of pallets picked for the pallet SKU based on comparing the threshold number of days to the historic spread for that pallet SKU in 208. In other words, as depicted in FIG. 2B, the point 218, which represents 6 pallets picked, indicates the comparison between the 15 day threshold and the historic spread of pallet picks for pallet SKU A. Thus, the number of bays for pallet SKU A can be 6, which is the number of pallets picked for SKU A at the 15 day threshold (the point 218). As shown in FIG. 2B, the number of bays selected can be more than the average daily pallet pick but less than the maximum daily pallet pick for the pallets of the particular SKU.

In some implementations, it can be preferred to select a number of bays that would provide for maintaining the maximum daily pallet pick in the pick aisle. As a result, the pick aisle may not run out of pallets of that particular SKU.

FIG. 3 depicts a process 300 for sorting historic pallet information. Sorting the historic pallet information can be advantageous to determine placement of each pallet SKU in the pick area. As described herein, it can be preferred to position pallet SKUs that are frequently picked closer to a front of the pick area to reduce an amount of time needed to collect pallets of those SKUs when they are requested in a pick order. Moreover, it can be preferred to position heavier pallet SKUs closer to the front of the pick area to reduce an amount of travel time and consumption of resources that may be used when having to move heavy items around the pick area. Sometimes, the heavier pallet SKUs may not be the pallet SKUs that are most frequently picked. Thus, the process 300 can be performed to strike a balance in positioning most frequently picked pallet SKUs with heaviest pallet SKUs along the pick aisles in the pick area in order to improve overall warehouse efficiency.

The process 300 can be performed by the computer system 102. The process 300 can also be performed by one or more other computing systems, servers, and/or devices. For illustrative purposes, the process 300 is described from the perspective of a computer system.

Referring to the process 300, the computer system can retrieve historic pallet information 301. The information 301 can be stored in a data store. The information 301 can also be received from a warehouse management system or another computing system or device. For example, one or more of the information 301 can be received from a vendor user device.

The information 301 can include information associated with one or more different SKUs. Some of the information 301 can include, for each of the SKUs, description of the corresponding item/product, average daily pallet pick, maximum daily pallet pick, number of bays to avoid a mid shift drop, and weight per pallet. In the example historic pallet information 301, SKUs A, B, C, and D have been retrieved. SKU A is associated with yogurt, and has an average daily pallet pick of 4.5, a maximum daily pallet pick of 10, 6 bays to avoid a mid shift drop, and is 80 lb per pallet. SKU B is associated with ice cream, and has an average daily pallet pick of 2, a maximum daily pallet pick of 7, 4 bays to avoid a mid shift drop, and is 50 lb per pallet. SKU C is associated with eggs, and has an average daily pallet pick of 7, a maximum daily pallet pick of 16, 8 bays to avoid a mid shift drop, and is 80 lb per pallet. SKU D is associated with chicken, and has an average daily pallet pick of 4.5, a maximum daily pallet pick of 9, 5 bays to avoid a mid shift drop, and is 100 lb per pallet.

The computer system can sort the historic pallet information 301 based on velocity in 302. Velocity can indicate how frequently pallets of a particular SKU are picked per day. Thus, in the historic pallet information 301, velocity is represented by the average daily pallet pick for each of the SKUs A, B, C, and D. The greater the number of average daily pallet pick, the increased velocity. In other words, a greater number of average daily pallet pick indicates that pallets of that particular SKU are more frequently being picked on a day to day basis.

With regards to the historic pallet information 301, SKU C is sorted at a top of the information 301, since SKU C has the highest average daily pallet pick of 7 pallets per day on average. SKU A and SKU D are sorted next in the information 301 since they have the second highest average daily pallet pick of 4.5 pallets per day on average. Finally, SKU B is sorted below SKUs C, A, and D since SKU B has the lowest average daily pallet pick of 2 pallets per day on average. Sorting based on velocity in 302 can indicate that pallets of SKU A should be positioned closer to the front of the pick area since these pallets are collected most frequently on a daily average. Pallets of SKU B may be positioned closer to a back of the pick area since these pallets are collected least often on a daily average.

Moreover, the computer system can sort the historic pallet information 301 based on weight in 304. Weight can act as a tiebreaker between pallet SKUs that have similar or same velocities. For example, in FIG. 3, SKUs A and D have the same average daily pallet pick of 4.5 pallets per day on average. In order to determine optimal positioning of each in the pick area, the computer system can sort SKUs A and D based on their weight per pallet. As mentioned throughout, it can be preferred to position heavier pallets closer to the front of the pick area. This positioning can be advantageous because it can reduce an amount of time, energy, and resources that may otherwise be required to move heavy pallets across greater distances in the pick area. Placing the heavier pallets closer to the front of the pick area can therefore reduce not only a distance that will need to be traveled with the heavier pallets but also improve overall efficiency in completing pick order requests.

In the example of FIG. 3, SKU D has a greater weight per pallet (100 lb per pallet) than SKU A (80 lb per pallet). Therefore, the computer system can sort pallets of SKU D above or before pallets of SKU A. This sort indicates that SKU D can be placed closer to the front of the pick area than SKU A.

A final sorted order of the historic pallet information 301 includes, from top to bottom: SKU C, SKU D, SKU A, and SKU B. Based on this sorted information, the computer system can determine that it can be preferred to position pallets of SKU C closest to the front of the pick area, pallets of SKU D second closest to the front of the pick area, pallets of SKU A closer to the back of the pick area, and pallets of SKU B closest to the back of the pick area (and farthest away from the front of the pick area).

Sorting the historic pallet information 301 can be performed before, during, and/or after any one or more of the processes described herein. Sometimes, the historic pallet information 301 can be sorted at a first time. One or more of the processes described herein can then be performed at second, later times in the future using the sorted historic pallet information 301. In some implementations, the computer system can sort the historic pallet information 301 in the process 300 before determining how many aisles to allot to the pick area (e.g., refer to FIGS. 10A-D). In some implementations, the computer system can sort the historic pallet information 301 as part of determining how many aisles to allot to the pick area. As another example, the computer system can sort the historic pallet information 301 before determining how many bays to allocate to each of the pallet SKUs A, B, C, and D (e.g., refer to FIGS. 2A-B). The sorted order of the pallet SKUs A, B, C, and D can then be used to determine the quantity of bays per SKU and/or whether to group the bays per SKU (e.g., refer to FIGS. 5A-C, 8A-B). Even more so, the sorted order of the pallet SKUs A, B, C, and D can be used to determine a quantity of dynamic bays to allot in the pick area and to identify which of the pallet SKUs may be positioned in the dynamic bays (e.g., refer to FIGS. 9A-B). Thus, sorting the historic pallet information 301 in the process 300 can be advantageous to perform one or more of the processes described herein, and not only to determine optimal assignment/placement of the pallet SKUs in the pick area.

Figure 4:
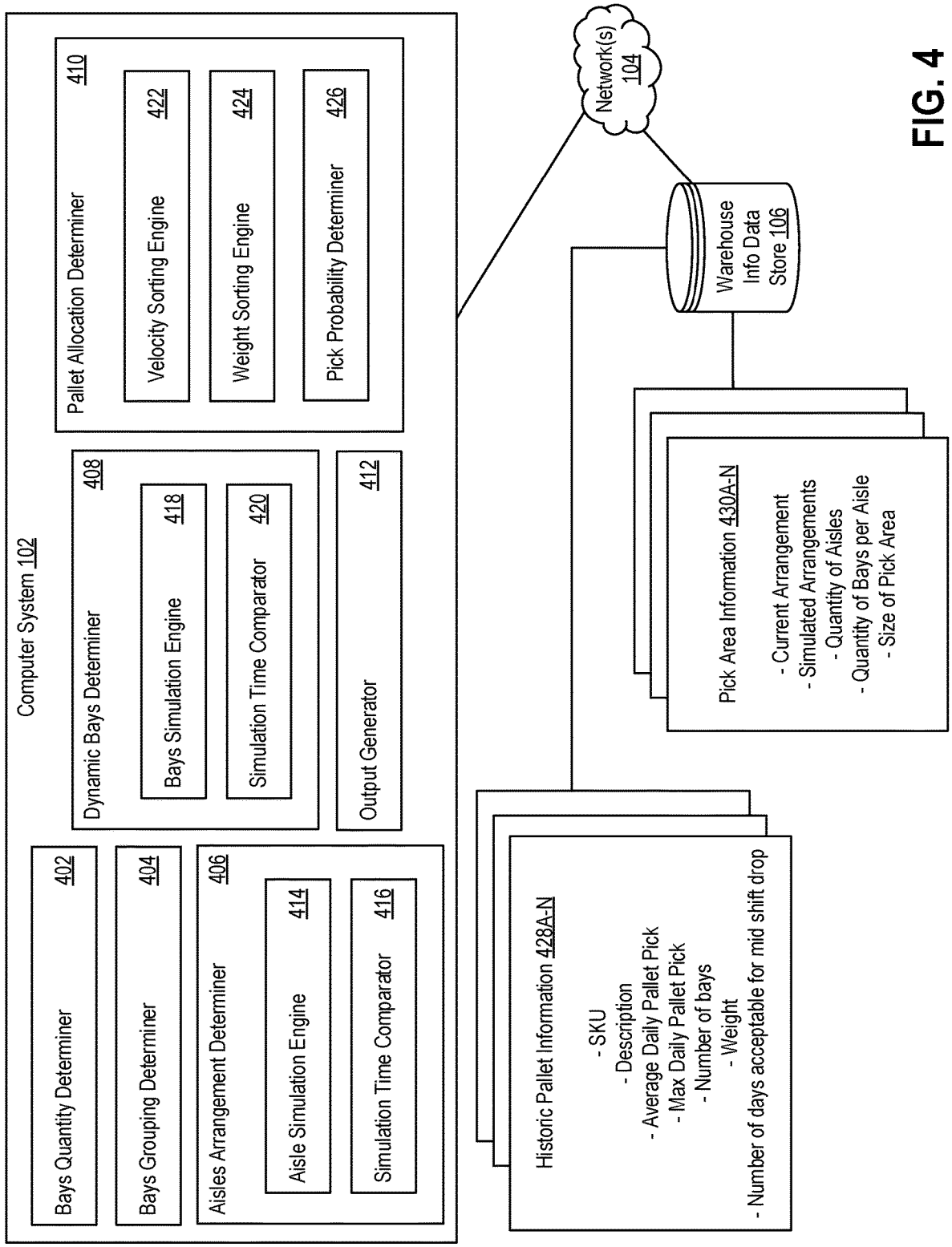
FIG. 4 is a system diagram of one or more components used to perform the techniques described herein.

FIG. 4 is a system diagram of one or more components used to perform the techniques described herein. The computer system 102 can be in communication (e.g., wired and/or wireless) with the warehouse information data store 106 via the network(s) 104. One or more additional computing systems, devices, servers, data stores, and/or networks of systems can be used to perform the techniques described herein. Moreover, one or more components of the computer system 102 can be part of separate or different computing systems, servers, and/or devices that are in communication via the network(s) 104.

As described throughout this disclosure, the computer system 102 can be configured to determine optimal pick area arrangements (e.g., layouts) that can improve warehouse efficiency. To do so, the computer system 102 can include a bays quantity determiner 402, a bays grouping determiner 404, an aisles arrangement determiner 406, a dynamic bays determiner 408, a pallet allocation determiner 410, and an output generator 412.

The bays quantity determiner 402 can determine how many bays, or locations in a pick area along pick aisles, to allocate per pallet SKU (e.g., refer to FIGS. 2A-B). The bays quantity determiner 402 can retrieve historic pallet information 428A-N from the warehouse information data store 106 for each pallet SKU. The historic pallet information 428A-N can include SKU, description of an item on the pallet, average daily pallet pick, maximum daily pallet pick, number of bays, weight, and number of days acceptable for a mid shift drop. One or more additional or fewer information can be included in the historic pallet information 428A-N. As described throughout this disclosure, the number of days acceptable for a mid shift drop can be the same for any pallet SKU. As described in reference to the process 200 in FIGS. 2A-B, the number of bays per pallet SKU can be based on a comparison of the number of days that is acceptable for a mid shift drop and a historic spread of a number of pallets that are picked per day, or the average daily pallet pic and maximum daily pallet pick. A determination of how many bays to allocate for the pallet SKU can be stored as the number of bays in the historic pallet information 428A-N.

The bays grouping determiner 404 can be configured to determine whether to group the number of bays for a particular pallet SKU or whether to spread them out across pick aisle(s) in the pick area (e.g., refer to FIGS. 5A-C, 8A-B). The bays grouping determiner 404 can retrieve the historic pallet information 428A-N and pick area information 430A-N from the warehouse information data store 106. The pick area information 430A-N can include a current arrangement of the pick area, one or more simulated arrangements, a quantity of aisles, a quantity of bays per aisle, and/or a size of the pick area. One or more additional or fewer information can be included in the pick area information 430A-N. As described in reference to FIGS. 5A-C and 8A-B, the bays grouping determiner 404 can determine arrangement of the bays for a particular pallet SKU based on a probability that the pallet SKU will be picked next. The more likely that more of the particular pallet SKU will be picked next, the more likely that the bays for the particular pallet SKU can be grouped together. Grouping can be advantageous to improve efficiency in picking pallet SKUs in larger quantities. As a result, warehouse workers may not have to expend significant energy, resources, and time traveling longer distances to collect the quantities of pallet SKUs that are requested in pick orders.

The aisles arrangement determiner 406 can be configured to determine an arrangement for the pick area that can improve warehouse efficiency (e.g., refer to FIGS. 10A-D). Aisle arrangements that reduce an amount of overall time to pick and complete pick order requests can be preferred. As described throughout this disclosure, one or more factors can be used to determine or otherwise measure which aisle arrangements may be optimal for the warehouse. For example, the factors can include distance traveled per pick order request, number of pallets built per pick order request, amount of time to travel distances to pick the pallets for the pick order request, amount of time to build the pick pallets (e.g., outbound pallets), and/or aggregate travel time to complete the pick order request from start to finish.

The aisles arrangement determiner 406 can determine how many aisles to have in the pick area and how long to make the aisles. The determiner 406 can balance the number of aisles with length of the aisles and overall efficiency in order to reduce travel time to complete pick order requests and also increase a footprint of storage space in the warehouse. A smaller but more efficient pick area footprint can be advantageous to open up more space in the warehouse for storing inbound pallets. Thus, overall efficiency of the warehouse can be improved.

The aisles arrangement determiner 406 can include an aisle simulation engine 414 and a simulation time comparator 416. The aisles arrangement determiner 406 can retrieve the historic pallet information 428A-N and the pick area information 430A-N from the warehouse information data store 106 in order to determine an optimal aisle arrangement in the pick area.

The aisle simulation engine 414 can be configured to generate any number of aisle arrangements for the pick area and test, or otherwise simulate, completing one or more pick orders in each of the generated aisle arrangements. Refer to process 1000 in FIGS. 10A-D.

The simulation time comparator 416 can be configured to determine how much time it may take for a warehouse worker to complete the one or more pick orders in each of the generated aisle arrangements. The simulation time comparator 416 can select an aisle arrangement that has a lowest aggregate travel time to complete pick order requests and build outbound pallets. Refer to FIGS. 10A-D for further discussion.

The dynamic bays determiner 408 can be configured to determine how many dynamic bays to allocate in the pick area (e.g., refer to FIGS. 9A-B). The dynamic bays determiner 408 can include a bays simulation engine 418 and a simulation time comparator 420. The dynamic bays determiner 408 can retrieve the historic pallet information 428A-N and the pick area information 430A-N from the warehouse information data store 106 in order to determine an optimal number of dynamic bays to allocate. The dynamic bays determiner 408 can retrieve the historic pallet information 428A-N for a particular time period, such as summer months. The dynamic bays determiner 408 can therefore look back over the particular time period to determine popularity, demand, and volume of each pallet SKU for a future time period, such as the upcoming summer months. Therefore, the quantity of dynamic bays that are assigned to the pick area can fluctuate based on the time period that the dynamic bays determiner 408 is assessing/looking back over.

Enough dynamic bays can be allocated to accommodate for pallet SKUs that are in high demand during one or more times/seasons of the year without compromising how many static bays are available for pallet SKUs that are consistently/routinely picked. Dynamic bays can receive any pallet SKU that can be in high demand at a given time. For example, when one pallet SKU is very popular, such as ice cream during a summer season, that pallet SKU can be allocated to the dynamic bays so that larger quantities of the pallet SKU can be placed there and picked from the dynamic bays. The number of dynamic bays can change from time to time, such as on a seasonal basis.

The bays simulation engine 418 can determine the number of dynamic bays to allocate based on simulating pick order requests in pick area arrangements that each of different quantities of dynamic bays. Refer to process 900 in FIGS. 9A-B for further discussion.

The simulation time comparator 420 can determine which of the simulated pick areas has a lowest aggregate travel time, which can include time to pick pallets for one or more pick order requests and to build outbound pick pallets. The quantity of dynamic bays in the pick area having the lowest aggregate travel time to complete the pick order requests can be selected by the simulation time comparator 420. Refer to process 900 in FIGS. 9A-B.

Figure 7:
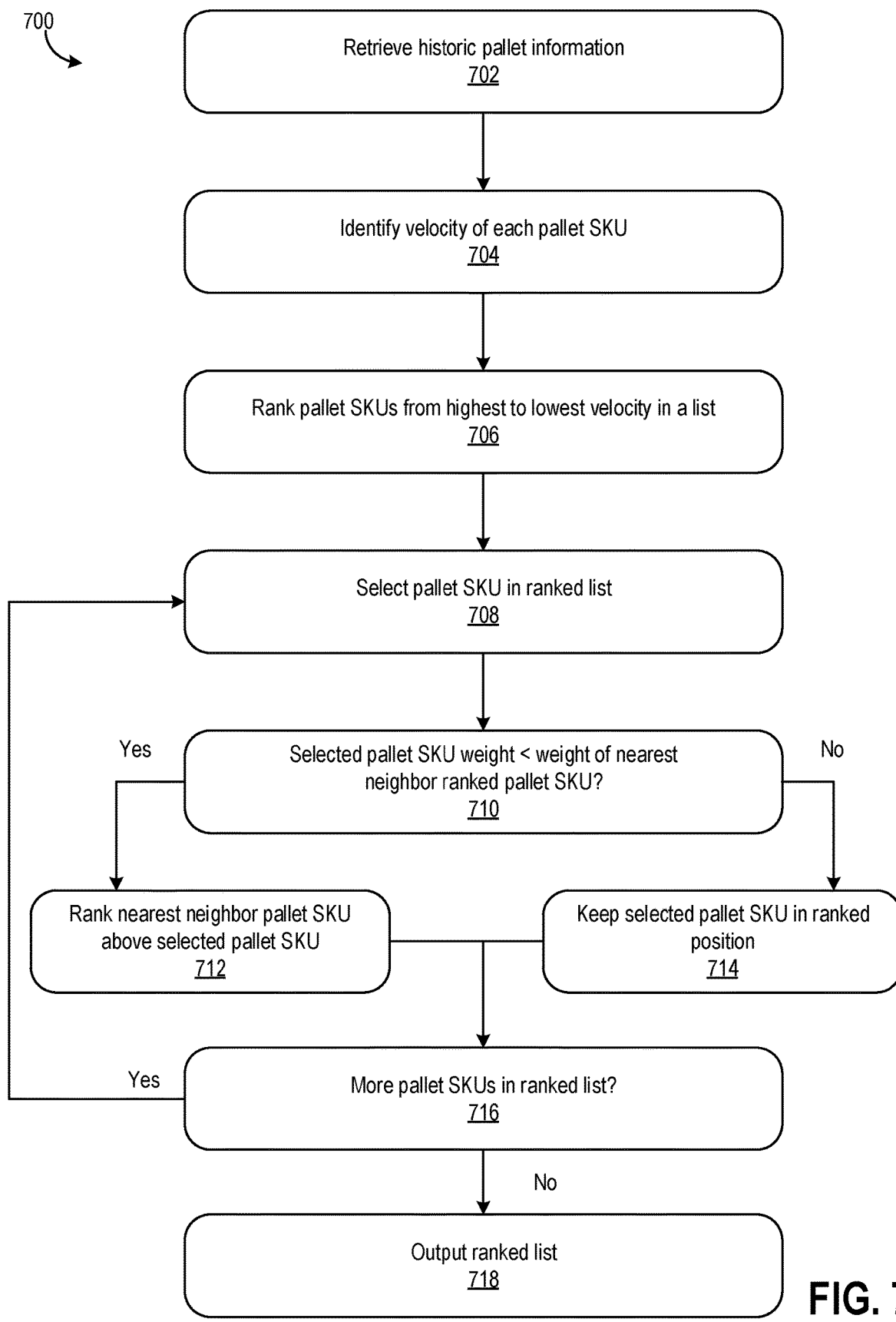
FIG. 7 is a flowchart of a process for sorting historic pallet information.

The pallet allocation determiner 410 can be configured to determine how to sort or otherwise arrange pallet SKUs in the pick aisles in the pick area (e.g., refer to FIGS. 3 and 7). As described throughout this disclosure, it can be preferred to place pallet SKUs that are frequently picked towards a front of the pick area in order to reduce an amount of time needed to complete pick order requests including the frequently picked pallet SKUs. Moreover, this can be balanced with weight of pallet SKUs, since it can be preferred to place pallet SKUs that weigh more towards the front of the pick area to reduce distance traveled and time needed to carry heavier pallet SKUs. The pallet allocation determiner 410 can therefore include a velocity sorting engine 422, a weight sorting engine 424, and a pick probability determiner 426. The pallet allocation determiner 410 can also retrieve the historic pallet information 428A-N from the warehouse information data store 106 in order to sort the pallet SKUs.

The velocity sorting engine 422 can be configured to sort pallet SKUs based on how often each of the pallet SKUs is picked. Pallet SKUs that are frequently picked can be sorted above or before pallet SKUs that are less frequently picked.

The weight sorting engine 424 can be configured to sort pallet SKUs based on how much a pallet of each SKU weighs. As described herein, in some implementations, weight can act as a tiebreaker between pallet SKUs having the same velocity or frequency of being picked. Thus, a pallet SKU that weighs more per pallet can be allocated a position in the pick aisle that is closer to the front of the pick area than a pallet SKU that weighs less per pallet. Refer to FIGS. 3 and 7 for further discussion on sorting and arranging pallets based on velocity and/or weight.

Figure 5A:
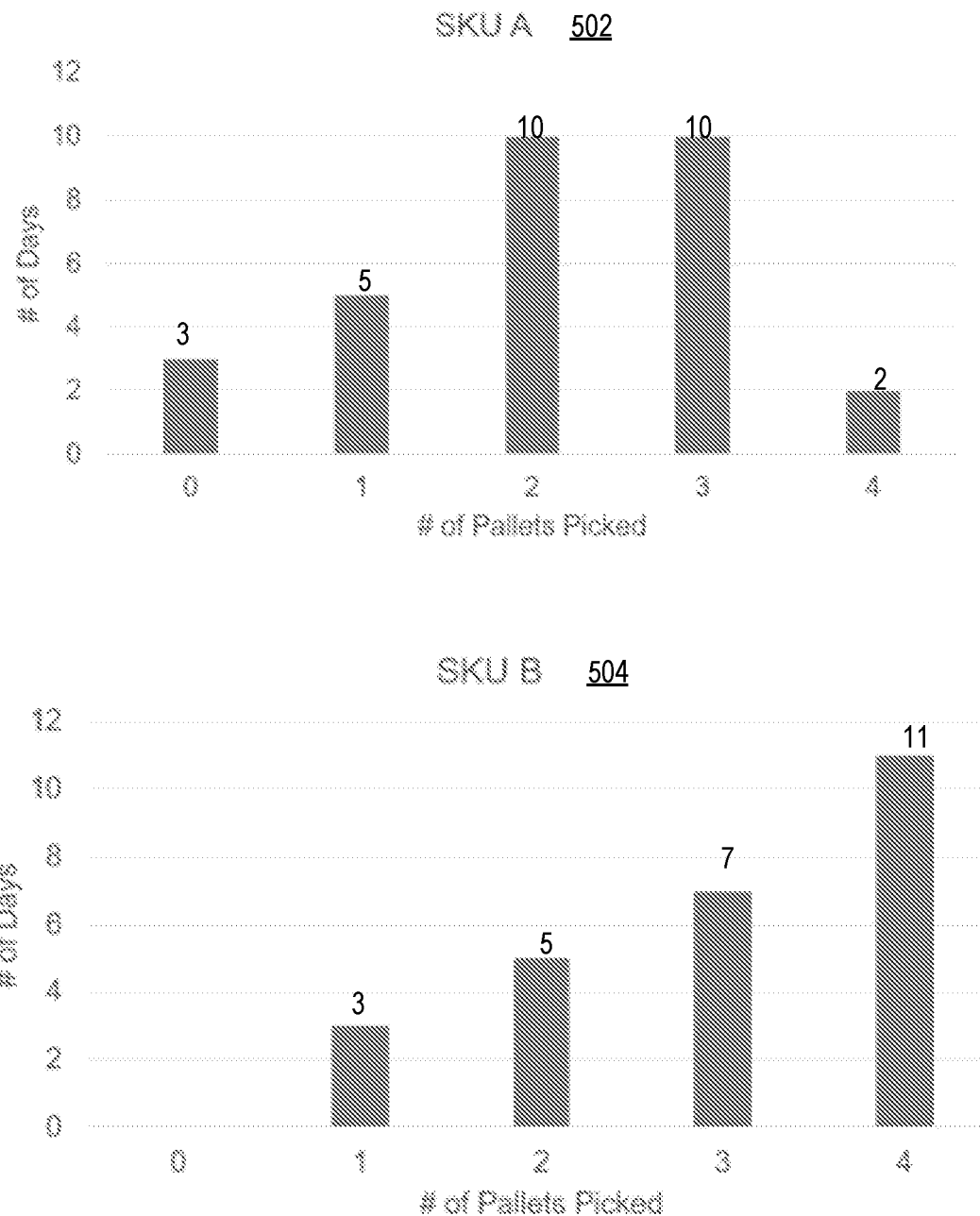
FIG. 5A is a graphical depiction of pallets picked per SKU.

The pick probability determiner 426 can be configured to determine a likelihood that each pallet SKU will be picked (e.g., refer to FIGS. 5A-C). This determination can then be used by the bays grouping determiner 404 to decide whether to group bays for a particular pallet SKU or whether to separate the bays out in the pick area.

The output generator 412 can be configured to generate output about the optimal pick area arrangement. For example, the output generator 412 can transmit to a user device information that includes a number of bays to allocate per pallet SKU, whether to group or separate the bays per pallet SKU, how many aisles and how long to make the aisles in the pick area, how many dynamic bays to allocate, and an order to position pallet SKUs based on velocity and/or weight. The user device can be a computing device and/or mobile device of a warehouse worker. The warehouse worker can be in charge of arranging the pick area based on the output received from the output generator 412.

The output generator 412 can also transmit any information about the optimal pick area arrangement to one or more other computing devices, systems, servers, and/or data stores. For example, the output generator 412 can transmit the number of dynamic bays to allocate to another computing system, which can be configured to determine, based on current pick order requests, where to position the dynamic bays in the pick area. The output can also be transmitted to any other computing systems in the warehouse that can use the output in order to determine additional efficiency improvements to make to the warehouse. For example, the other computing systems can use the output from the output generator 412 with real-time, current information about pick order requests and states of the warehouse in order to determine most efficient placement and organization of pallet SKUs in the pick area. Moreover, in some implementations, the information about the optimal pick area arrangement can be stored and accessed for later use in arranging or rearranging the pick area.

FIG. 5A is a graphical depiction of pallets picked per SKU. This information can be used in process 500 depicted in FIG. 5B in order to determine whether to group bays per pallet SKU or whether to separate bays per pallet SKU. FIG. 5B depicts the process 500 for allocating the pallets per SKU in FIG. 5A, based on probability of the pallets being picked (e.g., also refer to FIGS. 8A-B). FIG. 5C depicts example pick aisle arrangements based on probability of each of the pallets of FIG. 5B being picked.

Figure 8A:
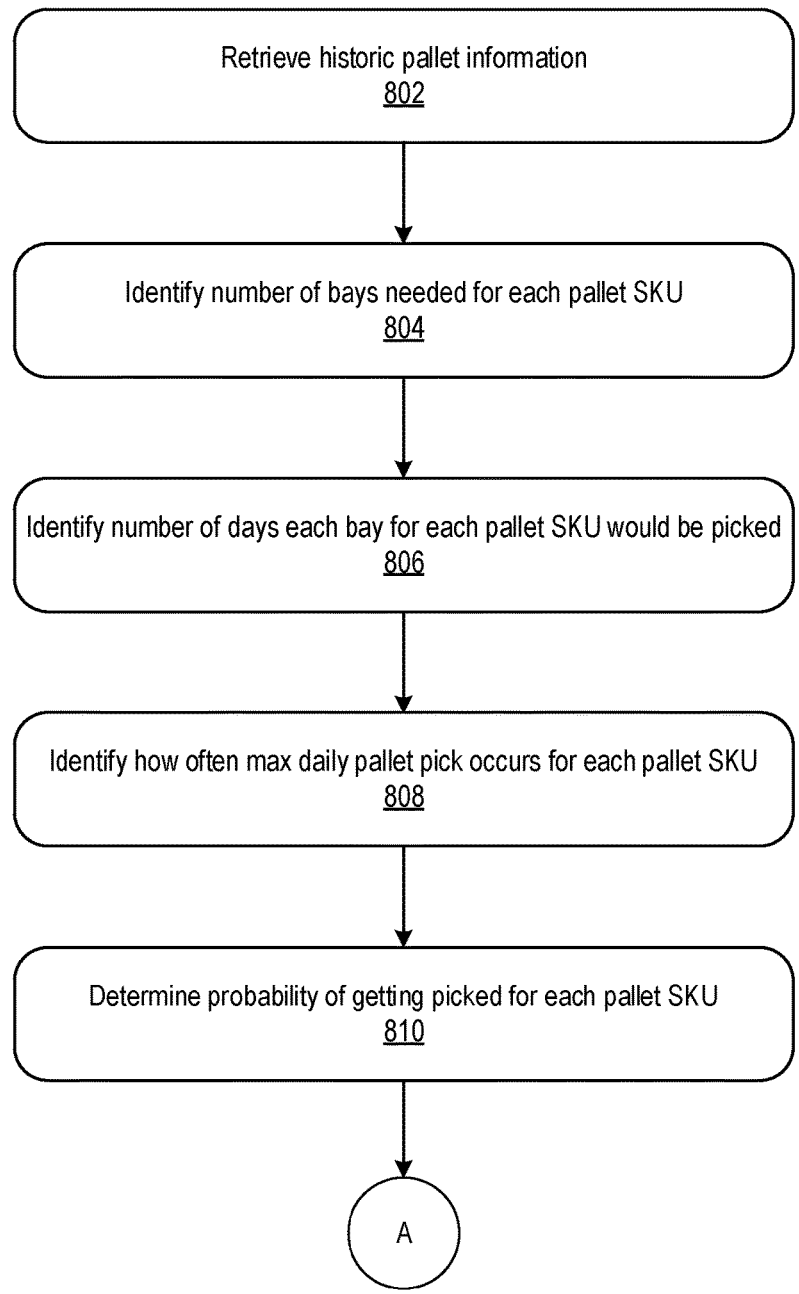
FIGS. 8A-B is a flowchart of a process for determining whether to group pallets of a particular SKU in a pick aisle arrangement.
Figure 8B:
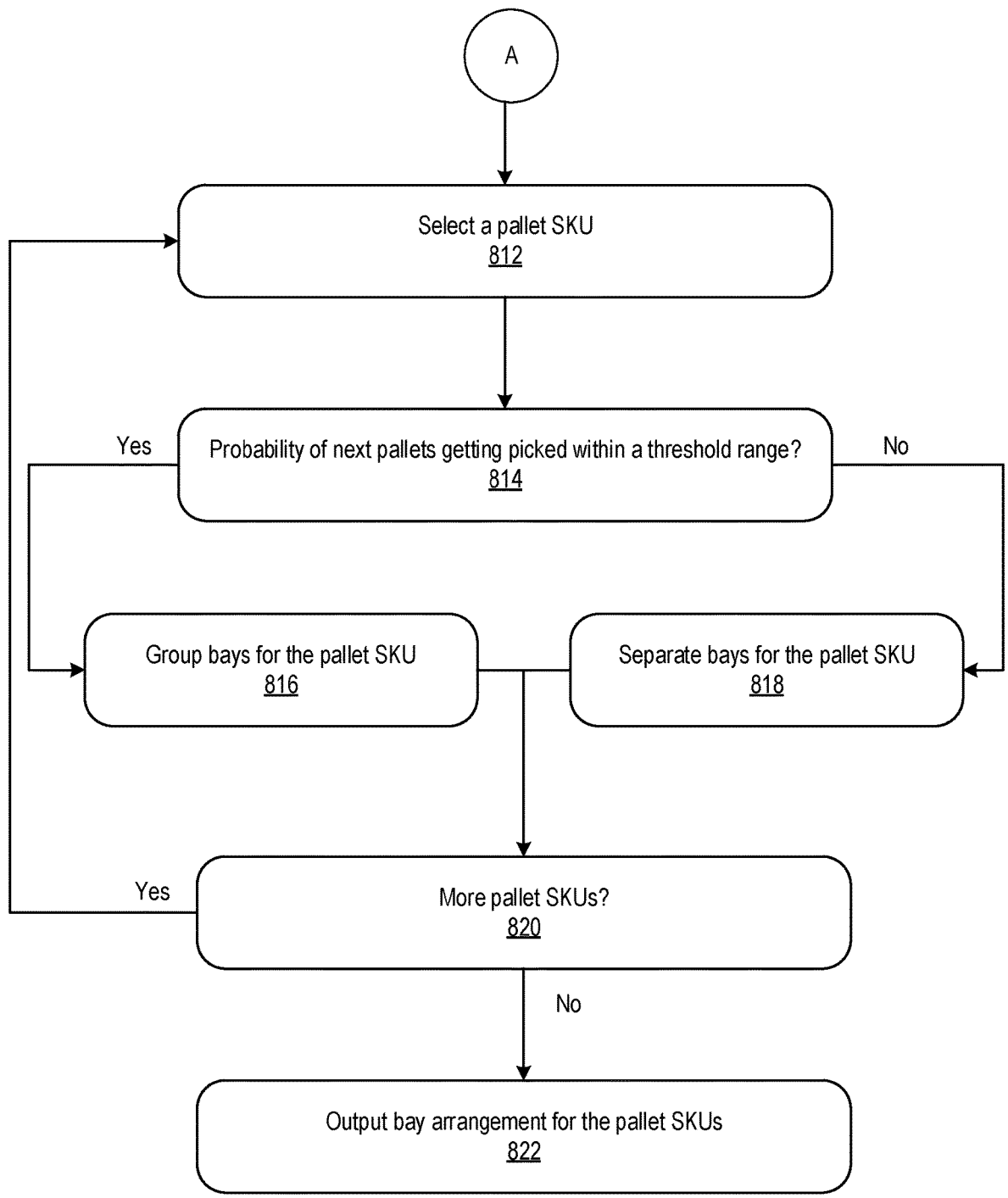

Referring to FIG. 5B, the process 500 can be performed by the computer system 102. The process 500 can also be performed by one or more other computing systems, servers, and/or devices. For illustrative purposes, the process 500 is described from the perspective of a computer system. Moreover, the process 500 is described in reference to process 800 in FIGS. 8A-B. FIGS. 8A-B is a flowchart of the process 800 for determining whether to group pallets of a particular SKU in a pick aisle arrangement. The process 800, like the process 500, can be used to determine whether to group bays (e.g., pallet pick locations) for the particular SKU or whether to disperse the pallets of the particular SKU throughout the pick aisle arrangement. The process 800, like the process 500, can be performed by the computer system 102. Performing the processes 500 and/or 800 can be advantageous to determine whether grouping bays can improve overall efficiency in completing pick orders. Sometimes, it can be advantageous to group pallets of a particular SKU so that they can be quickly picked at once, especially if the pallets of the particular SKU are picked in large quantities. Grouping the pallets of the particular SKU can be advantageous to reduce an amount of time needed to travel and pick up the requested pallets in a pick order request. The processes 500 and/or 800 can also be advantageous to strike a balance in grouping pallets of a particular SKU without hindering picking efficiency of other pallet SKUs that may be separated out in the pick area.

Referring to the process 500 in FIG. 5B and the process 800 in both FIGS. 8A-B, the computer system can retrieve historic pallet information (802), as described throughout this disclosure. The computer system can identify a number of bays needed for each pallet SKU (804). Determining the number of bays per pallet SKU, such as SKUs A and B in FIGS. 5A-C, can be based on the process 200 described in reference to FIGS. 2A-B. The computer system can also identify a number of days that each bay for each pallet SKU would be picked (806). This information can be stored in the historic pallet information that was retrieved. This information can be based on average and maximum daily pallet pick information. The computer system can identify how often a maximum daily pallet pick may occur for each pallet SKU (808).

For example, as shown in FIG. 5A, historic information about pallets of SKU A and SKU B can be retrieved by the computer system from a data store (the warehouse information data store 106). Daily pallet pick information can be graphed for each SKU, as SKU A graph 502 and SKU B graph 504. The graphs 502 and 504 can have number of pallets picked as an x axis and number of days picked as a y axis.

As shown in the SKU A graph 502, 0 pallets may be picked 3 days, 1 pallet may be picked 5 days, 2 pallets may be picked 10 days, 3 pallets may be picked 10 days, and 4 pallets may be picked 2 days. As shown in in the SKU B graph 504, 0 pallets may be picked 0 days (which means at least 1 pallet of SKU B is always picked), 1 pallet may be picked 3 days, 2 pallets may be picked 5 days, 3 pallets may be picked 7 days, and 4 pallets may be picked 11 days. The computer system can identify that a maximum daily pallet pick may occur for the pallets of SKU A twice—2 pallets are picked 10 days and 3 pallets are picked 10 days, based on the SKU A graph 502 (808 in the process 800 of FIGS. 8A-B). Similarly, the computer system can identify that a maximum daily pallet pick may occur for the pallets of SKU B only once, when 4 pallets are picked 11 days, based on the SKU B graph 504.

Referring back to the process 800 in FIGS. 8A-B, next, the computer system can determine a probability of getting picked for each pallet SKU (810). The probability can be a ratio of a number of days that each quantity of pallets of a particular SKU is picked to total number of days that the pallets of that SKU are picked. The probability can be any numeric value. As shown in FIG. 5B, probabilities can be percentages.

In FIG. 5B, probabilities of being picked are determined for the pallets of SKUs A and B. The probabilities are depicted in probabilities information 506. SKU A is measured over 30 days, which is a summation or total of the number of days that 0, 1, 2, 3, and 4 pallets are picked, as depicted in the SKU A graph 502 in FIG. 5A. SKU B is measured over 26 days, which is the summation of days that 0, 1, 2, 3, and 4 pallets are picked, as depicted in the SKU B graph 504 in FIG. 5A.

Regarding pallets of SKU A, 1 pallet of SKU A has a 90% probability, or 27/30, of being picked. After all, 1 pallet of SKU A can be picked 27 days out of 30. 2 pallets of SKU A have a 73% probability of being picked, or 22/30. 3 pallets of SKU A have a 40% probability of being picked, or 12/30. 4 pallets of SKU A have a 6% probability of being picked, or 2/30.

Regarding pallets of SKU B, there is a 100% probability that 1 pallet of SKU B will be picked. Thus, over 26 days, at least 1 pallet of SKU B is always picked. 2 pallets of SKU B have a probability of 88% of being picked, or 23/26. 3 pallets of SKU B have a 69% probability of being picked, or 18/26. 4 pallets of SKU B have a 42% probability of being picked, or 11/26.

Referring back to the process 800 in FIGS. 8A-B, the computer system can then select a pallet SKU (812). The computer system can determine whether a probability of next pallets of the pallet SKU getting picked is within a threshold range (814). The threshold range can be a percentage value, such as 10%. The threshold range can vary. For example, the threshold range can be any of 5%, 10%, 15%, 20%, 25%, etc. The threshold range can be any other preferred range. Determining whether the probability of next pallets is within the threshold range can be a form of ranking or otherwise sorting the pallets per SKU.

As an illustrative example, 1 pallet of a SKU C can have a 75% probability of being picked and 2 pallets of SKU C can have a 68% probability of being picked. Assuming the threshold range is 10%, 2 pallets of SKU C have a probability of being picked within the threshold range (7%). Therefore, the computer system can determine that the pallets of SKU C likely should be grouped in bays rather than separated out in the pick area. Grouping the bays for the pallets of SKU C can be advantageous to reduce an amount of travel time needed to fulfill pick order requests that may include 1 or 2 pallets of SKU C. On the other hand, if 4 pallets of SKU C have a 55% probability of being picked and 5 pallets of SKU C have a 20% probability of being picked, it can be preferred to separate the bays of 4 pallets and 5 pallets of SKU C. This is because the 20% probability for 5 pallets of SKU C is not within the 10% threshold range. Grouping bays for the 4 pallets and 5 pallets of SKU C may not improve overall efficiency for completing pick order requests in the warehouse. In fact, grouping the bays for the 4 pallets and 5 pallets of SKU C may cause inefficiencies in picking other pallet SKUs that may have higher picking volumes than pallet SKU C.

In some implementations, instead of ranking pallets per SKU based on whether probability of being picked is within a certain threshold range, the computer system can sort the pallets per SKU from highest to lowest probability, as depicted in FIG. 5B. For example, as shown in FIG. 5B, the computer system can rank 508 the probabilities information 506 into ranked probabilities information 510. In other words, the computer system can rank the pallet quantities for each SKU from highest probability of being picked to lowest probability of being picked. The ranked probabilities information 510 demonstrates that 1 pallet of SKU B having a 100% probability is ranked first, followed by 1 pallet of SKU A (90%), 2 pallets of SKU B (88%), 2 pallets of SKU A (73%), 3 pallets of SKU B (69%), 4 pallets of SKU B (42%), 3 pallets of SKU A (40%), and lastly, 4 pallets of SKU A (6%). Moreover, in some implementations, where one or more probabilities are the same, velocity and/or weight of each pallet per SKU can be assessed in order to determine how to rank those pallets.

Still referring to the process 800 in FIGS. 8A-B, if the probability of the next pallet getting picked is within the threshold range (814), the computer system can group bays for the pallet SKU in 816, as described above in the illustrative example. The computer system can proceed to block 820.

If, on the other hand, the probability of the next pallets getting picked is not within the threshold range (814), then the computer system can separate the bays allocated for the pallet SKU in 818, as described above. The computer system can proceed to block 820. In some implementations, the computer system can decide to separate bays for the pallet SKU based on one or more additional factors. For example, as described throughout this disclosure, it can be preferred to separate one or more bays for the pallet SKU if grouping them may increase travel time to complete pick order requests. Although bays for the pallet SKU can be grouped because their probabilities of being picked are within the threshold range, 5 pallets of the SKU can weigh significantly more than 4 pallets and/or 3 pallets. Thus, the 5 pallets of the SKU can be separated from the 4 pallets and/or the 3 pallets and positioned closer to a front of the pick area in order to reduce a distance that would need to be traveled with 5 pallets of the SKU, an amount of time needed to travel that distance with 5 pallets of the SKU, and an amount of energy/resources needed to travel that distance for the amount of time.

In 820, the computer system can determine whether there are more pallet SKUs to assess probability of being picked. If there are more pallet SKUs, the computer system can return to block 812 and repeat 812-820 until there are no more pallet SKUs to assess. If there are no more pallet SKUs to assess, then the computer system can output a bay arrangement for the pallet SKUs in 822. Outputting the bay arrangement can include storing the bay arrangement in a data store, such as the warehouse information data store 106.

The outputted bay arrangement can indicate which and/or how many bays to group and which and/or how many bays to separate per pallet SKU. In some implementations, the outputted bay arrangement can indicate where to place the grouped and/or separated bays in the pick aisles in the pick area. In yet some implementations, another computing system in the warehouse can determine placement of the grouped and/or separated bays in the pick area based on current, real-time information about pallet SKUs in the pick area.

As an example of the output, FIG. 5C depicts suggested pick aisle arrangements 512, 516, 518, and 520. The arrangements 512, 516, 518, and 520 can be determined based on highest to lowest probability that each quantity of pallets of SKUs A and B will be picked (e.g., refer to the ranked probabilities information 510 in FIG. 5B). Each of the arrangements 512, 516, 518, and 520 depict different positions of pallet SKUs A and B along aisle 515 in pick area 514. For example, the suggested pick aisle arrangement 512 depicts grouping 1 and 3 pallets of SKU B but otherwise separating 2 pallets and 4 pallets of SKU B. The suggested pick aisle arrangement 512 also depicts positioning 1 pallet of SKU A at the front of the aisle 515 while grouping together 2 pallets, 3 pallets, and 4 pallets of SKU A closer to a middle of the aisle 515.

The suggested pick aisle arrangement 516 depicts separating 1 pallet and 2 pallets of both SKUs A and B but grouping 3 pallets and 4 pallets of SKU A and 3 pallets and 4 pallets of SKU B. The suggested pick aisle arrangement 518 depicts separating and interchanging 1 pallet, 2 pallets, and 3 pallets of SKU A and B along one side of the aisle 515 and grouping 3 pallets and 4 pallets of SKU A along the other side of the aisle 515. The arrangements 516 and 518 can be based on ranking each quantity of pallets per SKU from highest to lowest probability of being picked. Refer to the ranked probabilities information 510 in FIG. 5B.

Suggested pick aisle arrangements can also be based on whether a probability of next pallets being picked is within a threshold range, as described in reference to the process 800 in FIGS. 8A-B. The suggested pick aisle arrangement 520 depicts positioning and grouping 1 pallet, 2 pallets, and 3 pallets of SKU B closer to the front of the aisle 515 along with 1 pallet and 2 pallets of SKU A while separating out 3 pallets and 4 pallets of SKU A with 4 pallets of SKU B towards an end of the aisle 515. 1, 2, and 3 pallets of SKU B can be grouped together because their corresponding probabilities (100%, 88%, 69%) can be within a particular threshold range, such as 20%, from each other. Since 4 pallets of SKU B can have a probability of 42% (e.g., refer to the probabilities information 506 in FIG. 5B), which is not within the 20% threshold range with the probability of 3 pallets of SKU B being picked, the 4 pallets of SKU B can be separated from the 1, 2, and 3 pallets of SKU B. Similarly, 1 and 2 pallets of SKU A can be grouped together because their corresponding probabilities (90%, 73%) can be within a particular threshold range, such as 20%, from each other. Since 3 pallets of SKU A can have a probability of 40%, which is not within the 20% threshold range with the probability of 2 pallets of SKU A being picked, the 3 pallets of SKU A can be separated from the 1 and 2 pallets of SKU A. Likewise, since 4 pallets of SKU A can have a probability of 6%, which is not within the 20% threshold range with the probability of 3 pallets of SKU A being picked, the 4 pallets of SKU A can be separated from the 3 pallets of SKU A.

The computer system can generate and output one or more additional or fewer pick aisle arrangements in 822 in FIGS. 8A-B. The suggested pick aisle arrangements 512, 516, 518, and 520 in FIG. 5C are merely some example arrangements that can be determined using the processes 500 and 800 depicted and described in reference to FIGS. 5A-C and 8A-B.

Figure 6:
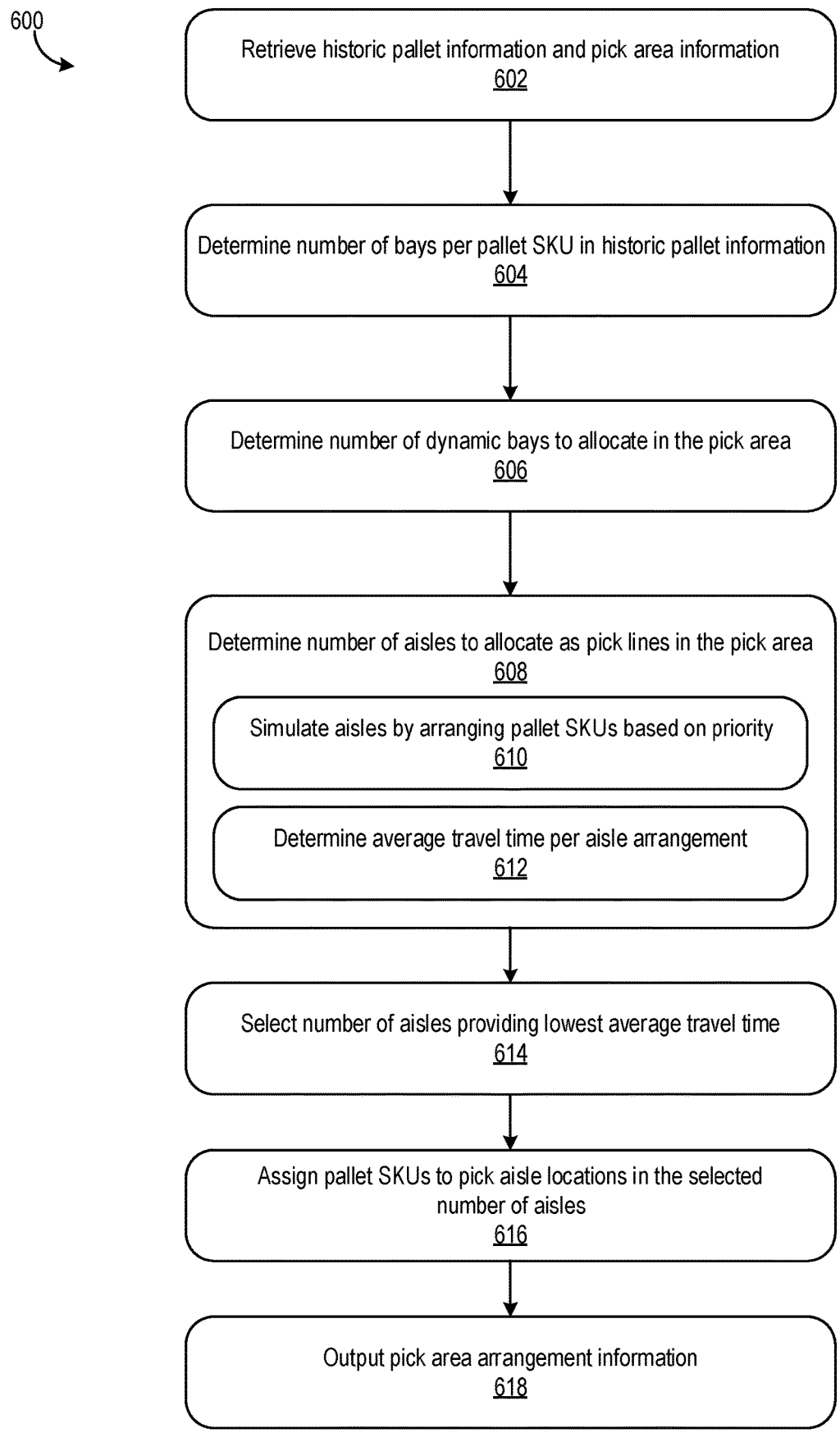
FIG. 6 is a flowchart of an overview process for determining a pick aisle arrangement for a warehouse.

FIG. 6 is a flowchart of an overview process 600 for determining a pick aisle arrangement for a warehouse (e.g., refer to FIG. 1). The process 600 can be performed by the computer system 102. The process 600 can also be performed by one or more other computing systems, servers, and/or devices. For illustrative purposes, the process 600 is described from the perspective of a computer system.

Referring to the process 600, the computer system can retrieve historic pallet information and pick area information in 602, as described throughout this disclosure. Refer to FIGS. 1 and 4 for further discussion. Using the historic pallet information, the computer system can determine a number of bays to allocate per pallet SKU in 604. The number of bays can be based on a comparison of a threshold number of days that is acceptable for a mid shift drop of any pallet SKU and a historic spread of a number of pallets picked per day per SKU. Refer to FIGS. 2A-B for further discussion.

The computer system can also determine a number of dynamic bays to allocate in the pick area in 606. The number of dynamic bays to allocate can be based on historic trends of pick order requests per pallet SKU over one or more predetermined periods of time. Refer to FIGS. 9A-B for further discussion.

The computer system can determine a number of aisles to allocate as pick lines in the pick area in 608. Determining the number of aisles to allocate can include simulating aisles by arranging the pallet SKUs from the historic pallet information into different pick aisle locations based on priority (610). As described herein, pallet SKUs that are picked more frequently, or have higher velocity, can be positioned closer to a front of the pick area while pallet SKUs that are picked less frequently, or having a lower velocity, can be positioned closer to a back of the pick area. As another example, pallet SKUs that are more frequently picked can be positioned in pick aisles closest to an area where outbound pallets are built while pallet SKUs that are less frequently picked can be positioned in pick aisles that are farthest away from the area where outbound pallets are built. In the first example, fewer, but longer aisles can be identified in the pick area. In the second example, more but shorter aisles can be identified in the pick area.

Determining the number of aisles to allocate can also include determining an average travel time per aisle arrangement to complete a pick order request having one or more of the pallet SKUs (612). For example, the computer system can determine whether one or more arrangements having fewer but longer pick aisles are more time efficient than one or more arrangements having more but shorter pick aisles. Refer to FIGS. 10A-D for further discussion.

The computer system can then select the number of aisle providing a lowest average travel time in 614. As described throughout this disclosure, a pick area arrangement having the lowest aggregate travel time can improve overall efficiency in the warehouse. Pick order requests can be performed and completed more efficiently, in less time, and/or using less resources, power, and/or energy. The warehouse can complete pick order requests and ship outbound pallets to customers on time, which can also improve customer satisfaction.

The computer system can assign the pallet SKUs to the pick aisle locations in the selected number of aisles in 616. Assignment can be based on velocity and weight of each pallet SKU, which is described further in reference to FIGS. 3 and 7. Thus, once an optimal arrangement of aisles is determined for the pick area, the computer system can determine optimal placement of pallets of each SKU in bays in the aisles. Pallets having increased velocity and/or higher weights can be positioned closer to a front of the pick area. Placement of the pallets can further be based on whether bays are grouped or separated per SKU, how many dynamic bays are designated in the pick aisles, and/or where dynamic bays are in the pick aisles.

The computer system can then output the pick area arrangement information in 618. For example, the computer system can transmit the pick area arrangement information to a user device, such as a mobile device, laptop, tablet, and/or computer. The user device can be used by a warehouse worker, such as a warehouse facility manager. The user can review the pick area arrangement information and use that information in order to arrange or rearrange the pick area. The pick area arrangement information can include but is not limited to a number of bays to allocate per pallet SKU, how many and/or which bays to group together per pallet SKU, where to position grouped and/or separated bays per pallet SKU, how many bays to allocate as dynamic bays, where to position the dynamic bays in the pick area, how many aisles to allocate in the pick area, how many bays or other pick locations each aisle can have, and where to place/position each of the pallet SKUs in the pick area.

In some implementations, outputting the pick area arrangement information in 618 can include storing the information in a data store, such as the warehouse information data store 106. In some implementations, outputting the pick area arrangement information can include transmitting the information to another computing system for further processing and analysis. For example, another computing system can receive the number of dynamic bays to allocate in the pick area. The another computing system can then determine, based on current information about pallet SKUs in the warehouse, an optimal placement/positioning of the dynamic bays in the pick area and/or which pallet SKUs to put into the dynamic bays. One or more other processes can be performed by one or more other computing systems, using the pick area arrangement information, in order to improve overall warehouse efficiency.

Moreover, in some implementations, one or more blocks in the process 600 can be performed in one or more different orders. One or more of the blocks in the process 600 can also be performed simultaneously, in series, and/or at different time periods.

FIG. 7 is a flowchart of a process 700 for sorting historic pallet information (e.g., refer to FIG. 3). As described throughout, historic pallet information can be sorted based on velocity and/or weight. Sorting the historic pallet information based on velocity and/or weight can be advantageous to determine where to position pallet SKUs in a pick area. The process 700 can be performed by the computer system 102. The process 700 can also be performed by one or more other computing systems, servers, and/or devices. For illustrative purposes, the process 700 is described from the perspective of a computer system.

Referring to the process 700, the computer system can retrieve historic pallet information as described throughout this disclosure (702). The computer system can identify velocity of each pallet SKU from the historic pallet information in 704. The velocity can be based on average daily pallet pick per SKU. The computer system can then rank the pallet SKUs from highest to lowest velocity in a list in 706.

In the process 300 in FIG. 3, for example, pallet SKU C had an average daily pallet pick of 7, which indicates that, on average, 7 pallets of SKU C are picked per day. This was the highest velocity amongst the pallet SKUs A, B, C, and D, so the computer system ranked SKU C at the top of the historic pallet information 301. The computer system then ranked pallet SKUs A, D, and B in descending order based on their decreasing velocities (4.5 average daily pallet pick, 4.5 average daily pallet pick, 2 average daily pallet pick, respectively).

Still referring to 706 in the process 700, the computer system can also determine how to rank the pallet SKUs based on picking statistics over a predetermined time period. For example, the computer system can evaluate picking statistics over the past 90 days for each pallet SKU. The predetermined time period can be one or more other time periods, including but not limited to 30 days, 60 days, 75 days, 100 days, 180 days, 365 days, etc. The predetermined time period for look back can be different based on SKU, customer, time of year, geography, season, quarter, etc. In some implementations, the predetermined time period can be 330 days or more in order to determine forward looking trends for any particular pallet SKU.

As an illustrative example, over the past 90 days, a SKU associated with a first flavor of ice cream is picked more often than a SKU associated with a second flavor of ice cream, then it can be preferred to rank the SKU for the first flavored ice cream over the SKU for the second flavored ice cream. Looking back over the predetermined time period can be advantageous to determine how popular a particular item is. After all, just because an item is picked a lot over an aggregate period of time, which means it has a high velocity, that item may not continue to be popularly picked at such a high velocity during the predetermined time period. A popular item during the predetermined time period can therefore be ranked above a less popular item during that predetermined time period even if the less popular item has a higher velocity than the popular item in the aggregate.

Next, the computer system can select a pallet SKU from the ranked list in 708. For example, the computer system can start at the top of the ranked list and select the pallet SKU with the highest velocity. As another example, the computer system can select a pallet SKU that has a same velocity as another pallet SKU. As described below, weight can be a tiebreaker for determining how to rank pallet SKUs that have the same velocity.

Accordingly, the computer system can determine whether a weight of the selected pallet SKU is less than a weight of a nearest neighbor ranked pallet SKU in 710. If the selected pallet SKU weighs less than the nearest neighbor ranked pallet SKU, then the computer system can rank the nearest neighbor pallet SKU above the selected pallet SKU in 712. The computer system can then proceed to block 716.

If, on the other hand, the selected pallet SKU weighs more than the nearest neighbor ranked pallet SKU, then the computer system can keep the selected pallet SKU in its ranked position in the list in 714. The computer system can then proceed to block 716.

Pallets that weigh more can be ranked higher on the list so that they are positioned closer to a front of the pick area. As a result, warehouse workers can move the heavier pallets over shorter distances, which can reduce an amount of travel time and/or energy/resources needed to pick and move the heavier pallets.

In the process 300 in FIG. 3, for example, the computer system selected SKU A, which has the same velocity (4.5 average daily pallet pick) as SKU D. Weight per pallet became the tiebreaker in sorting or otherwise ranking SKUs A and D for positions in the pick area. Since SKU D weighed more per pallet (100 lb/pallet versus 80 lb/pallet), SKU D was ranked above SKU A. This ranking indicates that pallets of SKU D can be positioned closer to the front of the pick area than pallets of SKU A. After all, as described throughout this disclosure, heavier pallets can be positioned closer to the front of the pick area to reduce an amount of travel distance, travel time, and energy/resources needed to move the heavier pallets around the pick area.

Still referring to the process 700 in FIG. 7, in 716, the computer system can determine whether there are any more pallet SKUs in the ranked list to assess based on weight. For example, the computer system can look for any pallet SKUs that have the same velocity. The computer system may only adjust rankings based on weight for pallet SKUs that have the same velocity. So, if there are more pallet SKUs having the same velocity, the computer system can return to block 708 and repeat 708-716 until all of the pallet SKUs are compared based on weight. If there are no more pallet SKUs that have the same velocity in the ranked list in 716, then the computer system can output the ranked list in 718.

As described throughout, outputting the ranked list can include transmitting the ranked list to a user device of a warehouse worker, such as a warehouse facility manager. The warehouse worker can use the ranked list in order to change an arrangement of the pallet SKUs in the pick area. Outputting the ranked list can also include transmitting the ranked list to another computing system for further processing. For example, another computing system can use the ranked list to determine, based on current conditions in the warehouse, which bays to place each of the pallet SKUs in. In some implementations, outputting the ranked list can include storing the list in a data store, such as the warehouse information data store 106, for future processing and/or analysis.

FIGS. 9A-B is a flowchart of a process 900 for determining a quantity of dynamic pick locations to assign in a pick aisle arrangement. As described herein, the dynamic pick locations can be dynamic bays. Dynamic bays are locations in the pick area that can receive any pallet SKU at any given time. Static bays are locations in the pick area that can be designated or otherwise allocated to one or more particular SKUs for one or more periods of time. Having static bays can be advantageous to help warehouse workers know where pallets are located. This can be advantageous to help the warehouse workers more quickly and efficiently pick pallets from their known, designated locations. Although dynamic bays can be filled with pallets of different SKUs, the dynamic bays are advantageous because they can be used to accommodate for unexpected spikes or changes in velocity or volume for any pallet SKU on a daily, monthly, seasonal, or other time basis.

During summer, for example, ice cream can be very popular, and therefore can populate one or more dynamic bays in addition to or instead of static bays. During winter, ice cream may no longer be as popular, so ice cream may just populate static bays. In this example, the computer system can decide to allocate more dynamic bays in the pick area during the summer months versus during the winter months. Increasing the pick area size and/or increasing the number of bays that are dynamic during the summer months can be advantageous to efficiently fulfill pick order requests that include ice cream. Therefore, the pick area can keep up with the increased demand for and volume of ice cream. Contracting the pick area size and/or decreasing the number of bays that are dynamic (and therefore increasing a number of bays that are static) during the winter months can be advantageous to efficiently fulfill pick order requests that include any of the pallet SKUs that are positioned in the pick area. In some implementations, the same number of dynamic bays can be allotted in the pick area year round, but the dynamic bays can be populated by different pallet SKUs based on their velocity, popularity, and/or weight.

As another example, crackers can be a very popular product a couple weeks leading up to July $4^{th}$, while turkeys can be a very popular product a couple weeks leading up to Thanksgiving. Based on determining how many pallets of crackers and/or turkeys are picked per these time periods, the computer system may also allocate a different number of dynamic bays per time period. For example, more crackers can be stored per pallet than turkeys per pallet and more turkeys may be required than crackers. Therefore, during the weeks leading up to July $4^{th}$, fewer dynamic bays can be allocated in the pick area. These dynamic bays can be used by pallets of crackers. On the other hand, during the weeks leading up to Thanksgiving, more dynamic bays can be allocated in the pick area since fewer turkeys can fit per pallet, which means more pallets of turkeys will need to be stored in the pick area to meet increased demand for the turkeys. These dynamic bays can then be used by pallets of turkeys.

The process 900 can be performed by the computer system 102. The process 900 can also be performed by one or more other computing systems, servers, and/or devices. For illustrative purposes, the process 900 is described from the perspective of a computer system.

Referring to the process 900 depicted in both FIGS. 9A-B, the computer system can retrieve historic pallet information over a threshold period of time and pick area information. The historic pallet information can include all pallet pick orders (or some quantity of pallet pick orders) for a predetermined number of days, such as a past 30 days, 60 days, 90 days, 180 days, 365 days, etc. The computer system can also retrieve the historic pallet information for a particular season, such as summer, fall, winter, and/or spring. As a result, the computer system can look back over the threshold period of time in order to identify pick order trends based on pallet SKU.

The computer system can then determine one or more quantities of dynamic bays to allocate for the pick area in 904. The computer system can randomly determine how many pick aisle arrangements to generate. The computer system can also randomly determine the quantity of dynamic bays to allocate for each of the generated pick aisle arrangements. For example, a first pick aisle arrangement can be randomly assigned 6 dynamic bays while a second pick aisle arrangement can be randomly assigned 10 dynamic bays. In some implementations, the computer system can determine quantities of dynamic bays to allocate that are within a threshold range. For example, the computer system can determine one or more quantities of dynamic bays where each quantity would include dynamic bays that make up 5-10% of all bays in the pick area and/or within a particular pick aisle. For example, the computer system can determine 3 different quantities of dynamic bays for the pick area. A first quantity (or pick aisle arrangement) can include 5 dynamic bays, a second quantity can include 7 dynamic bays, and a third quantity can include 9 dynamic bays. Any one or more other quantities of dynamic bays and number of dynamic bays per quantity can be determined by the computer system.

The computer system can intersperse the quantities of dynamic bays throughout the pick area in the one or more pick area arrangements (906). For example, the computer system can randomly choose locations for the dynamic bays in each of the different generated pick aisle arrangements. In some implementations, the computer system can intersperse the dynamic bays in one or more predetermined arrangements or positions in the pick area.

As an illustrative example, if, historically, dynamic bays have been positioned in a front of the pick area, in a middle of the pick area, and in a back of the pick area, then the computer system can generate 3 pick aisle arrangements. In one of the pick aisle arrangements, all the dynamic bays can be positioned in the front of the pick area. In a second of the pick aisle arrangements, all the dynamic bays can be positioned in the middle of the pick area. In a third of the pick aisle arrangements, all the dynamic bays can be positioned in the back of the pick area. One or more other pick aisle arrangements and placement of dynamic bays can be realized.

The computer system can also receive (i) a list of pallet SKUs that can be placed in one or more dynamic bays and (ii) a picking order for the list of pallet SKUs in 908. The information (i) and/or (ii) can be retrieved with the historic pallet information from the data store in 902. The information (i) and/or (ii) can also be received from a warehouse management system (WMS) or other computer system in the warehouse. The information (i) and/or (ii) can be historic and/or can be based on current or recent pick order requests.

For example, the computer system can receive a list of SKUs associated with items that are very popular during the summer. The list can include SKUs for ice creams, crackers, and sunscreens. The list can also include SKUs for items that may not be very popular but nonetheless are requested in pick orders during the summer. The computer system can also receive an order by which each of the items in the list may be picked. The picking order can be based on a picking order that was used in the past to fulfill one or more pick order requests having the list of items described herein. The pick order can be random in some implementations. The pick order can also be based on one or more other factors such as customer, velocity, weight, temperature, maximum support load capacity, quantity, etc.

The computer system can then simulate placement of the pallet SKUs in one or more dynamic bays based on their picking order for each of the pick area arrangements in 910. In each of the pick arrangements, the computer system can assign the pallet SKUs from the list to one or more of the dynamic bays. Pallet SKUs that are highest in the picking order can, for example, be placed in more dynamic bays and/or dynamic bays that are closest to the front of the pick area. Pallet SKUs that are lowest in the picking order can, for example, be placed in fewer dynamic bays, in dynamic bays that are closest to a back of the pick area, and/or not in any of the dynamic bays. In some implementations, the computer system can randomly place the pallet SKUs in the dynamic bays for one or more of the pick area arrangements.

Next, the computer system can simulate distance traveled to complete the picking order in each of the pick area arrangements in 912. Thus, once the pallet SKUs are placed throughout the interspersed dynamic bays in each pick area arrangement, the computer system can determine how long it would take warehouse workers to complete the picking order received in 908. The computer system therefore can determine distances/times needed to move throughout the pick area to each of the dynamic bays where the pallet SKUs have been placed. The determined distances/times can be used by the computer system to determine which of the pick area arrangements has an optimal quantity of dynamic bays and/or placement of the dynamic bays. In 908, the computer system can be testing whether any of the pick area arrangements can support a predetermined period of time in which there is increased volume of movement with regards to one or more pallet SKUs. The optimal quantity of dynamic bays and/or placement of the dynamic bays can provide for decreased travel time and/or distances traveled in completing pick order requests.

The computer system can determine a number of pallets to build in order to complete the picking order in each of the pick area arrangements (914). The number of pallets to build can be based on quantities of each of the pallet SKUs in the list of pallet SKUs to pick and height, weight, or other size limitations for outbound pallets. The number of pallets to build can also be based on customer preferences. The number of pallets to build can influence how much time and/or distance is traveled to complete the picking order.

Then, the computer system can determine an aggregate amount of time to travel the distance to build the number of pallets in each of the pick area arrangements in 916. The aggregate amount of time can include time used for building the outbound pallets after pallet SKUs have been picked for each of the outbound pallets. In some implementations, it can take warehouse workers more time to build more pallets. The warehouse workers would have to travel more distances to pick the pallets for each pallet build. For example, each pallet build can require a separate trip around the pick area to collect the pallets for that pallet build. In some implementations, it can take warehouse workers less time to build more pallets because each pallet build can weigh less than a single pallet containing al the pallet SKUs for the pick order. The less weight that is carried by the warehouse workers around the pick area, the less time and resources the warehouse workers may use to complete the pick order and build the multiple pallets. As another example, in some implementations, it can take warehouse workers more time to build fewer pallets. For example, building a single pallet can take more time than building multiple smaller pallets because the single pallet can include many pallet SKUs of varying weights. The more weight that the warehouse workers have to move around the pick area to build the single pallet, the more amount of time and resources will be used to complete the pick order and build the single pallet.

The computer system can select the pick area arrangement with the quantity of dynamic bays having the lowest aggregate travel time to complete the picking order in 918. In some implementations, the selected pick area arrangement may result in building more pallets to complete the picking order because in the aggregate, warehouse workers would be spending less time traveling distances between the quantity of dynamic bays in the selected pick area arrangement.

Accordingly, the computer system can return the quantity of dynamic bays for the selected pick area arrangement in 920. Returning the quantity of dynamic bays can include outputting the quantity at a user device of a warehouse worker, such as a warehouse facility manager. Returning the quantity of dynamic bays can include storing the quantity in a data store for later/future use, processing, and/or analysis. In some implementations, returning the quantity of dynamic bays can include transmitting the quantity to another computing system. The another computing system can be configured to determine, based on current information associated with the warehouse, where to position the dynamic bays in the pick area and/or which pallet SKUs to place in each of the dynamic bays for a current time. Therefore, the determined quantity of dynamic bays can be deployed in the warehouse at the current time and/or used in arranging the pick area during a future time.

In some implementations, the computer system can determine the aggregate amount of time to travel (916) and select the optimal pick area arrangement (918) based on applying a time penalty to the aggregate amount of time to travel. The penalty can relate to an amount of time that is allocated for each pallet build as more pallets are added to an aisle in the pick area. The computer system can also allocate a time estimate to each pallet build based on a number of aisles or size of the pick area. This time estimate, or penalty, can be added to the aggregate amount of time to travel in the pick area arrangement in order to complete the picking order. Thus, the more aisles and/or pallets in an aisle, the more likely it will take warehouse workers longer, in the aggregate, to complete the picking orders. This penalty can therefore be used to quantify efficiency of the pick area arrangement.

Figure 10A:
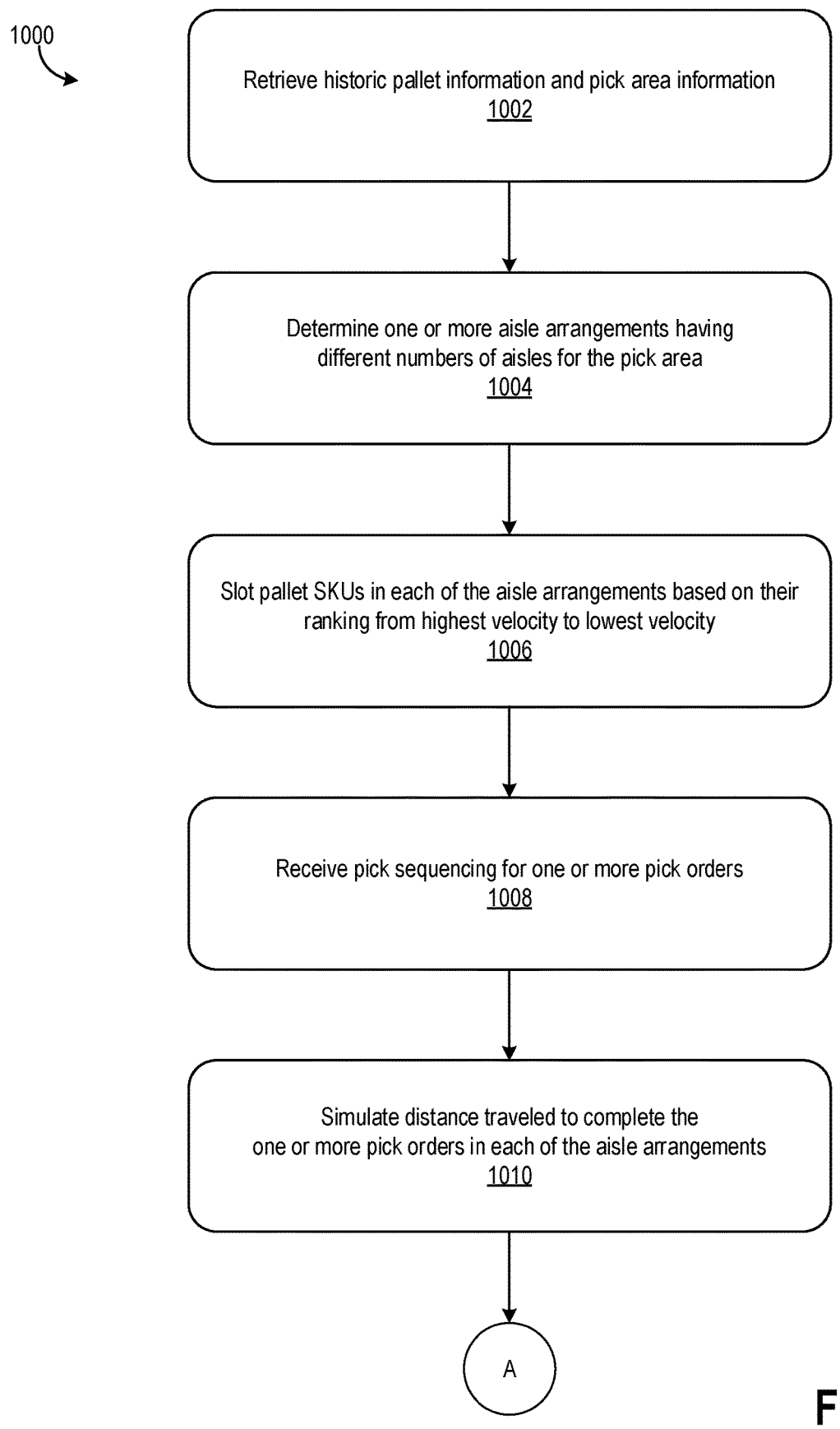
FIGS. 10A-B is a flowchart of a process for determining an optimal number of pick aisles in a pick aisle arrangement.
Figure 10B:
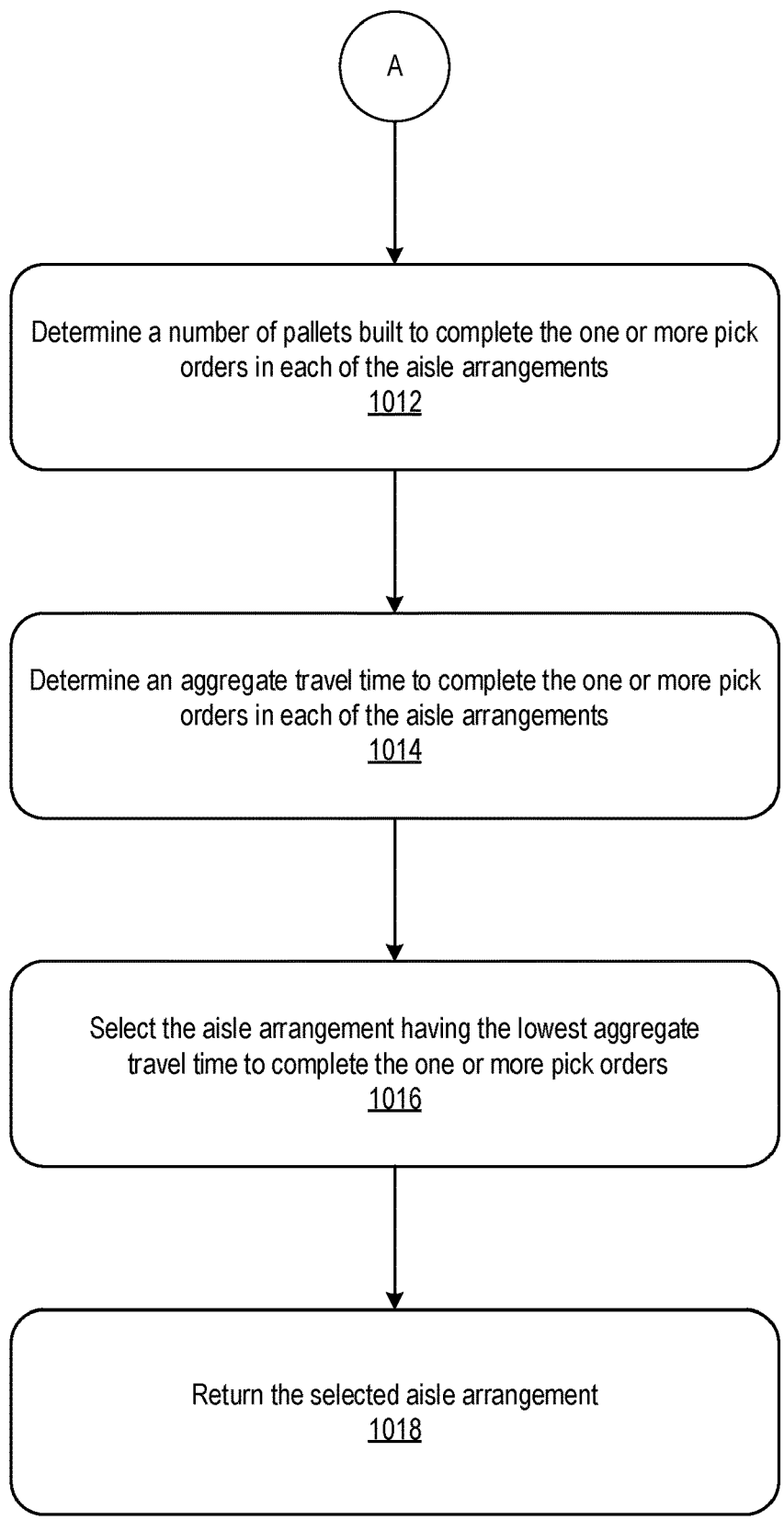
Figure 10C:
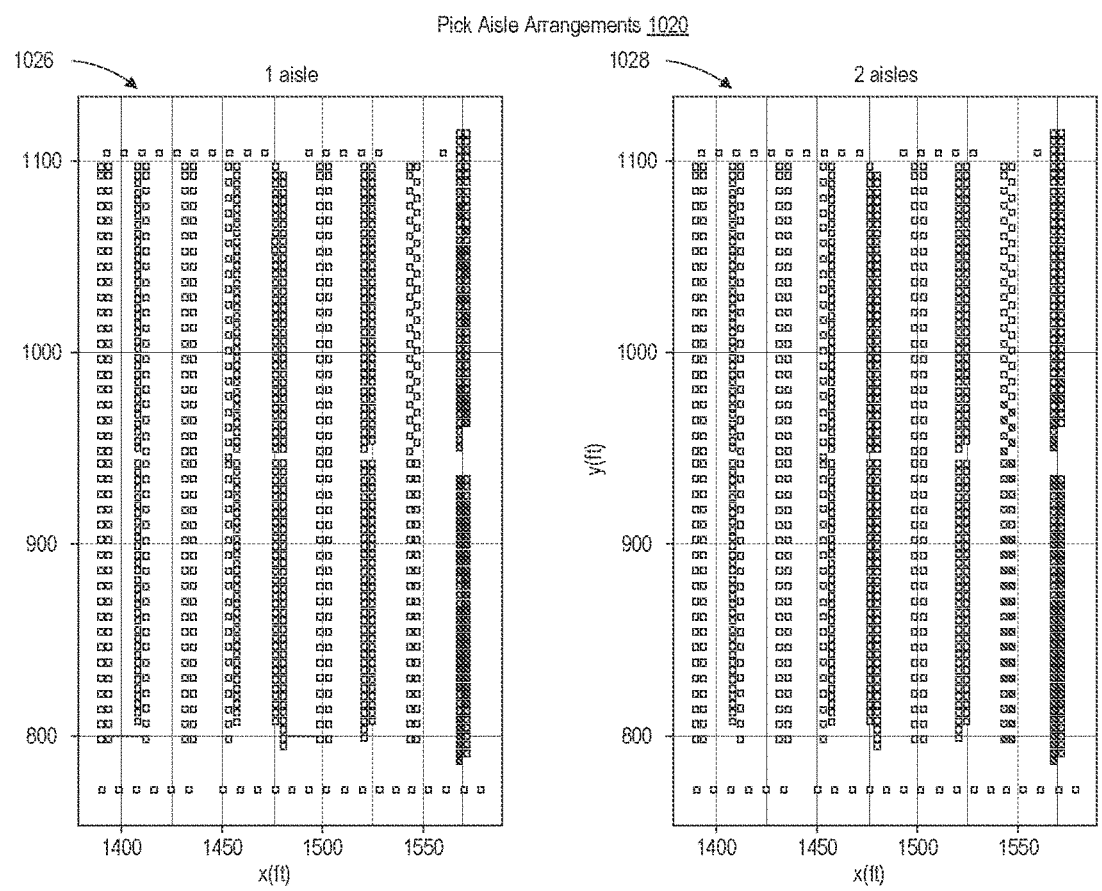
FIG. 10C and FIG. 10C (Cont.) depict example pick aisle arrangements having different numbers of pick aisles.
Figure 10C:
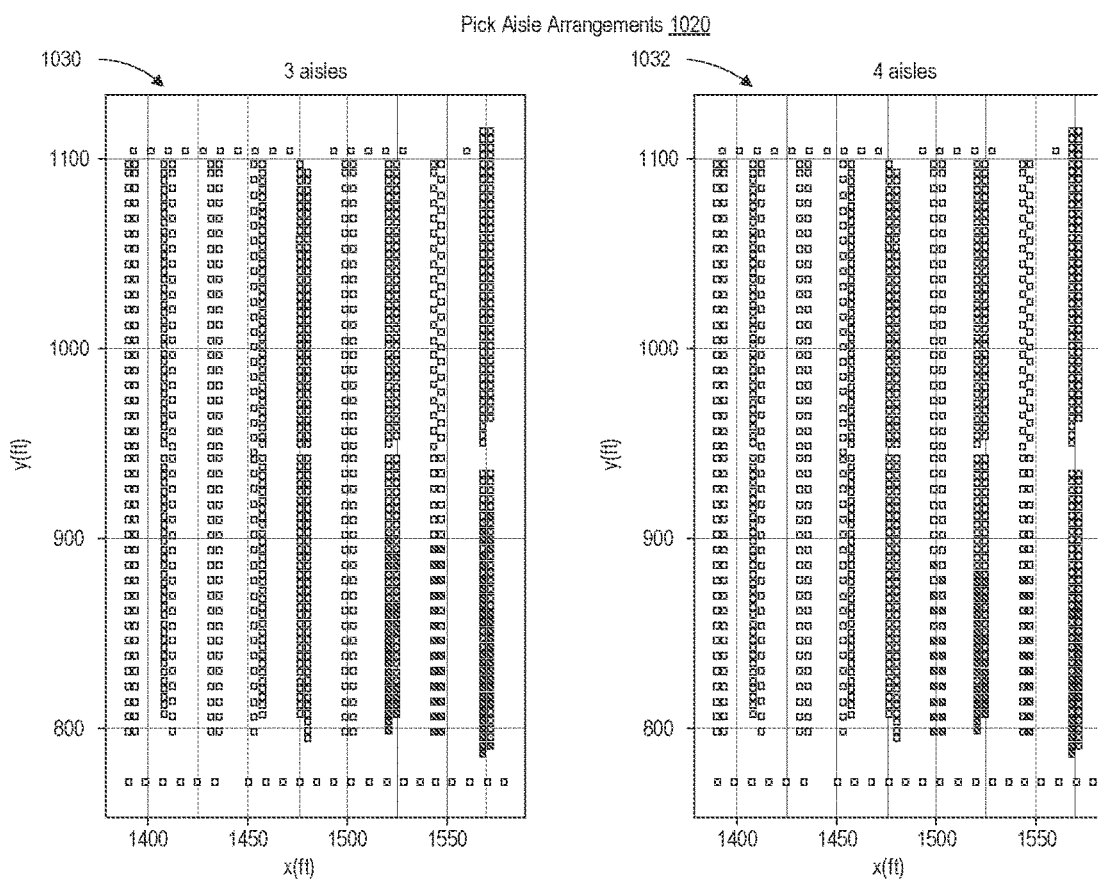

FIGS. 10A-B is a flowchart of a process 1000 for determining an optimal number of pick aisles in a pick aisle arrangement. The process 1000 can be used to simulate various different pick aisle arrangements to assess efficiency in completing pick order requests. FIG. 10C and FIG. 10C (Cont.) depict example pick aisle arrangements having different numbers of pick aisles. FIG. 10D is a graphical depiction of efficiency associated with different pick aisle arrangements.

Referring to FIGS. 10A-B, the process 1000 can be performed by the computer system 102. The process 1000 can also be performed by one or more other computing systems, servers, and/or devices. For illustrative purposes, the process 1000 is described from the perspective of a computer system.

Referring to the process 1000 in both FIGS. 10A-B, the computer system can retrieve historic pallet information and pick area information in 1002, as described throughout this disclosure. The computer system can determine one or more aisle arrangements having different numbers of aisles for the pick area in 1004. The computer system can determine random numbers of aisles per aisle arrangement. The computer system can also determine a random number of aisle arrangements to generate. The number of aisle arrangements and aisles to generate in 1004 can also be based on one or more factors, such as historic pick area arrangements, and/or historic warehouse performance/efficiency information.

As shown in FIG. 10C and FIG. 10C (Cont.), 4 pick aisle arrangements 1020 have been generated by the computer system. Pick area arrangement 1026 depicts 1 aisle that can be used in the pick area. As shown, the 1 aisle can be long, going from a front to a back of the pick area. Pick area arrangement 1028 depicts 2 aisles that can be used in the pick area. In comparison to the arrangement 1026, since pallets are distributed over 2 aisles instead of 1, the 2 aisles can be shorter than 1 aisle. In FIG. 10C and FIG. 10C (Cont.), the 2 aisles are half a length of the 1 aisle of the pick area arrangement 1026. Pick area arrangement 1030 depicts 3 aisles. The 3 aisles appear slightly shorter than the 2 aisles in the pick area arrangement 1028 since the pick pallets can be dispersed across 3 aisles instead of just 2. Finally, the pick area arrangement 1032 depicts 4 aisles. The 4 aisles are slightly shorter than the 3 aisles in the pick area arrangement 1030 since the pick pallets can be dispersed across 4 aisles instead of 3. One or more additional or fewer pick aisle arrangements can be realized using the process 1000.

Referring back to the process 1000 in FIGS. 10A-B, the computer system can then slot pallet SKUs in each of the aisle arrangements based on their ranking from highest velocity to lowest velocity in 1006. The ranking can be determined using the processes 300 and 700 described herein (e.g., refer to FIGS. 3 and 7). In the example pick aisle arrangements 1020 in FIG. 10C and FIG. 10C (Cont.), the pallet SKUs can be positioned in different places along the pick aisles based on how many pick aisles there are. For example, in the pick area arrangement 1026 with 1 aisle, a low velocity item may be positioned at the back of the aisle in the pick area. However, in the pick area arrangement 1028 with 2 aisles, the same low velocity item may instead be positioned midway down one of the aisles in the pick area. This placement can result in less travel time by a warehouse worker who is tasked with picking that low velocity item. Even more so, in the pick area arrangement 1030 with 3 aisles, the same low velocity item may be positioned even closer to the front of the pick area, which can result in less travel time to pick that low velocity item. Finally, in the pick area arrangement 1032 with 4 aisles, the same low velocity item can be positioned closer to the front of the pick area. However, because the pick area is now spread out laterally rather than longitudinally (more but shorter aisles), it may take warehouse workers more time to travel across the 4 aisles than across 3 or 2 aisles to pick the low velocity item.

In some implementations, as described herein, the computer system can slow the pallet SKUs in each of the aisle arrangements based on weight. For example, weight can be a placement tiebreaker where two or more of the pallet SKUs have the same velocity.

The computer system can also receive pick sequencing information for one or more pick orders in 1008. The information can be retrieved with the historic pallet information from the data store in 1002. The information can also be received from a warehouse management system (WMS) or other computer system in the warehouse. The information can be historic and/or can be based on current or recent pick order requests. The pick sequencing information can indicate an order by which pallet SKUs can be picked in order to fulfill the one or more pick orders.

The computer system can simulate distance traveled to complete the pick orders in each of the aisle arrangements in 1010. As described throughout this disclosure, the computer system can determine how long it would take warehouse workers to collect the pallet SKUs in the appropriate pick sequencing order in each of the aisle arrangements. In the example pick aisle arrangements 1020 of FIG. 10C and FIG. 10C (Cont.), the computer system can simulate fulfilling a pick order request in the 1 aisle arrangement 1026, the 2 aisle arrangement 1028, the 3 aisle arrangement 1030, and the 4 aisle arrangement 1032. For further discussion about simulating distance traveled, refer to 912 in FIGS. 9A-B.

The computer system can also determine a number of pallets to build to complete the pick orders in each of the aisle arrangements in 1012. The number of pallets to build can influence how much time may be needed to complete the pick orders, as described in reference to FIGS. 9A-B (e.g., refer to 914). Sometimes, for example, it can take less time to build more pallets across 4 aisles versus building 1 pallet across 1 aisle. In this example, 4 aisles can be shorter in length than 1 aisle, and 1 pallet can be built per aisle. It can take less time for the warehouse workers to travel the shorter distances to build pallets per aisles. Moreover, building 1 pallet across 1 aisle can take more time and resources since the warehouse workers may have to travel longer distances with more weight.

Next, the computer system can determine an aggregate travel time needed to complete the pick orders in each of the aisle arrangements in 1014. As described throughout (e.g., refer to 916 in FIGS. 9A-B), the aggregate travel time can include time needed to build the one or more outbound pallets for each of the pick orders.

The computer system can select the aisle arrangement having the lowest aggregate travel time in order to complete the pick orders in 1016 (e.g., refer to 918 in FIGS. 9A-B).

For example, referring to FIG. 10D, pick aisle arrangement efficiency graph 1022 depicts an example efficiency comparison for different pick aisle arrangements. Pick aisle arrangement efficiency graph 1024 depicts an example efficiency comparison for different pick aisle arrangements based on time per pick order. More specifically, the graph 1022 demonstrates, for each number of pick line aisles, an average distance traveled per pick order and a number of outbound pallets generated per order. It can be preferred to select a number of pick line aisles that results in a least amount of distance traveled per order while maintaining an optimal number of outbound pallet builds per order. As shown in the graph 1022, when there is only 1 aisle, greater distances can be traveled per order and fewer pallets can be built per order. If more pallets are built per order, then it can take up more time to complete the pick order in the 1 aisle arrangement. Similarly, when there are 8 aisles, significant distances can be traveled per order since the pallets are spread out across many aisles. Moreover, when there are 8 aisles, more pallets can be built per order in order to reduce weight that the warehouse workers would have to carry across 8 aisles. Therefore, an 8 aisle arrangement may be as inefficient as a 1 aisle arrangement.

Based on the graph 1022, the optimal pick aisle arrangement can be a 3 aisle arrangement. With 3 aisles, the least amount of distance is traveled per order. Moreover, a significant number of outbound pallets can be built per order without causing an increase in distance that needs to be traveled per order. This suggests that it can take the warehouse workers the least amount of time to complete pick orders using the 3 aisle arrangement, which is confirmed by the graph 1024.

The graph 2024 depicts the aggregate amount of time needed per order for each of the pick aisle arrangements. The aggregate amount of time needed per order includes travel time and time to move pallets per order. As shown, in the 1 aisle arrangement, approximately 21.26 minutes are needed in the aggregate to complete a pick order. In the 8 aisle arrangement, approximately 21.51 minutes are needed to complete a pick order. In the 3 aisle arrangement, on the other hand, approximately 19.53 minutes are needed to complete a pick order. The computer system can therefore select the 3 aisle arrangement as most optimal to not only reduce distance traveled, but also reduce time needed to complete pick order requests. In the example warehouse in FIG. 10C and FIG. 10C (Cont.), arranging the pick area into 3 aisles instead of the current pick line arrangement can save the warehouse 9.7 minutes per pick order. Overall efficiency in the warehouse can therefore improve.

Referring back to the process 1000 in FIGS. 10A-B, the computer system can then return the selected aisle arrangement in 1018. Refer to 920 in FIGS. 9A-B for further discussion about returning the selected aisle arrangement.

Figure 11:
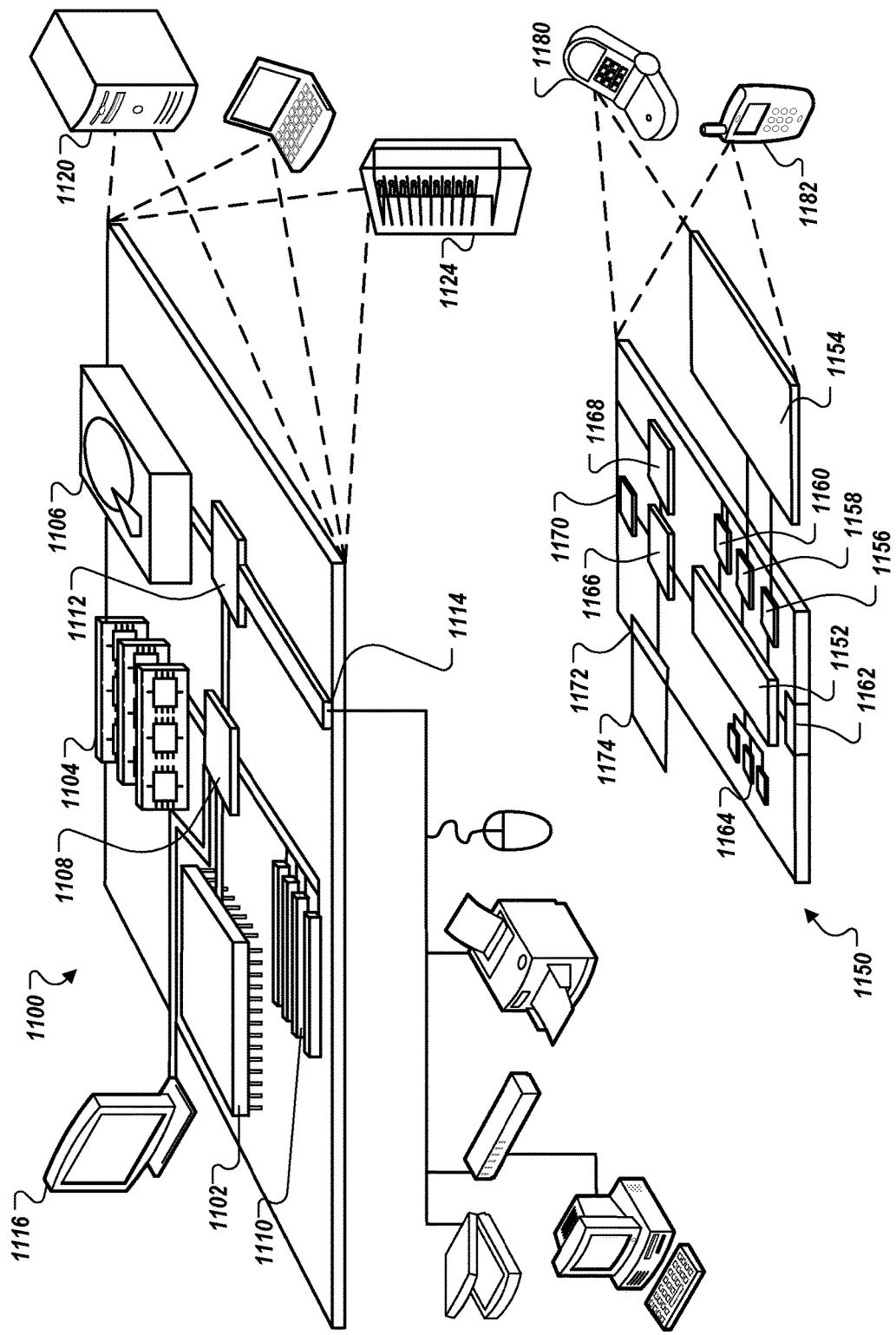
FIG. 11 is a schematic diagram that shows an example of a computing device and a mobile computing device.

FIG. 11 shows an example of a computing device 1100 and an example of a mobile computing device that can be used to implement the techniques described here. The computing device 1100 is intended to represent various forms of digital computers, such as laptops, desktops, workstations, personal digital assistants, servers, blade servers, mainframes, and other appropriate computers. The mobile computing device is intended to represent various forms of mobile devices, such as personal digital assistants, cellular telephones, smart-phones, and other similar computing devices. The components shown here, their connections and relationships, and their functions, are meant to be exemplary only, and are not meant to limit implementations of the inventions described and/or claimed in this document.

The computing device 1100 includes a processor 1102, a memory 1104, a storage device 1106, a high-speed interface 1108 connecting to the memory 1104 and multiple high-speed expansion ports 1110, and a low-speed interface 1112 connecting to a low-speed expansion port 1114 and the storage device 1106. Each of the processor 1102, the memory 1104, the storage device 1106, the high-speed interface 1108, the high-speed expansion ports 1110, and the low-speed interface 1112, are interconnected using various busses, and can be mounted on a common motherboard or in other manners as appropriate. The processor 1102 can process instructions for execution within the computing device 1100, including instructions stored in the memory 1104 or on the storage device 1106 to display graphical information for a GUI on an external input/output device, such as a display 1116 coupled to the high-speed interface 1108. In other implementations, multiple processors and/or multiple buses can be used, as appropriate, along with multiple memories and types of memory. Also, multiple computing devices can be connected, with each device providing portions of the necessary operations (e.g., as a server bank, a group of blade servers, or a multi-processor system).

The memory 1104 stores information within the computing device 1100. In some implementations, the memory 1104 is a volatile memory unit or units. In some implementations, the memory 1104 is a non-volatile memory unit or units. The memory 1104 can also be another form of computer-readable medium, such as a magnetic or optical disk.

The storage device 1106 is capable of providing mass storage for the computing device 1100. In some implementations, the storage device 1106 can be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product can also contain instructions that, when executed, perform one or more methods, such as those described above. The computer program product can also be tangibly embodied in a computer- or machine-readable medium, such as the memory 1104, the storage device 1106, or memory on the processor 1102.

The high-speed interface 1108 manages bandwidth-intensive operations for the computing device 1100, while the low-speed interface 1112 manages lower bandwidth-intensive operations. Such allocation of functions is exemplary only. In some implementations, the high-speed interface 1108 is coupled to the memory 1104, the display 1116 (e.g., through a graphics processor or accelerator), and to the high-speed expansion ports 1110, which can accept various expansion cards (not shown). In the implementation, the low-speed interface 1112 is coupled to the storage device 1106 and the low-speed expansion port 1114. The low-speed expansion port 1114, which can include various communication ports (e.g., USB, Bluetooth, Ethernet, wireless Ethernet) can be coupled to one or more input/output devices, such as a keyboard, a pointing device, a scanner, or a networking device such as a switch or router, e.g., through a network adapter.

The computing device 1100 can be implemented in a number of different forms, as shown in the figure. For example, it can be implemented as a standard server 1120, or multiple times in a group of such servers. In addition, it can be implemented in a personal computer such as a laptop computer 1122. It can also be implemented as part of a rack server system 1124. Alternatively, components from the computing device 1100 can be combined with other components in a mobile device (not shown), such as a mobile computing device 1150. Each of such devices can contain one or more of the computing device 1100 and the mobile computing device 1150, and an entire system can be made up of multiple computing devices communicating with each other.

The mobile computing device 1150 includes a processor 1152, a memory 1164, an input/output device such as a display 1154, a communication interface 1166, and a transceiver 1168, among other components. The mobile computing device 1150 can also be provided with a storage device, such as a micro-drive or other device, to provide additional storage. Each of the processor 1152, the memory 1164, the display 1154, the communication interface 1166, and the transceiver 1168, are interconnected using various buses, and several of the components can be mounted on a common motherboard or in other manners as appropriate.

The processor 1152 can execute instructions within the mobile computing device 1150, including instructions stored in the memory 1164. The processor 1152 can be implemented as a chipset of chips that include separate and multiple analog and digital processors. The processor 1152 can provide, for example, for coordination of the other components of the mobile computing device 1150, such as control of user interfaces, applications run by the mobile computing device 1150, and wireless communication by the mobile computing device 1150.

The processor 1152 can communicate with a user through a control interface 1158 and a display interface 1156 coupled to the display 1154. The display 1154 can be, for example, a TFT (Thin-Film-Transistor Liquid Crystal Display) display or an OLED (Organic Light Emitting Diode) display, or other appropriate display technology. The display interface 1156 can comprise appropriate circuitry for driving the display 1154 to present graphical and other information to a user. The control interface 1158 can receive commands from a user and convert them for submission to the processor 1152. In addition, an external interface 1162 can provide communication with the processor 1152, so as to enable near area communication of the mobile computing device 1150 with other devices. The external interface 1162 can provide, for example, for wired communication in some implementations, or for wireless communication in other implementations, and multiple interfaces can also be used.

The memory 1164 stores information within the mobile computing device 1150. The memory 1164 can be implemented as one or more of a computer-readable medium or media, a volatile memory unit or units, or a non-volatile memory unit or units. An expansion memory 1174 can also be provided and connected to the mobile computing device 1150 through an expansion interface 1172, which can include, for example, a SIMM (Single In Line Memory Module) card interface. The expansion memory 1174 can provide extra storage space for the mobile computing device 1150, or can also store applications or other information for the mobile computing device 1150. Specifically, the expansion memory 1174 can include instructions to carry out or supplement the processes described above, and can include secure information also. Thus, for example, the expansion memory 1174 can be provide as a security module for the mobile computing device 1150, and can be programmed with instructions that permit secure use of the mobile computing device 1150. In addition, secure applications can be provided via the SIMM cards, along with additional information, such as placing identifying information on the SIMM card in a non-hackable manner.

The memory can include, for example, flash memory and/or NVRAM memory (non-volatile random access memory), as discussed below. In some implementations, a computer program product is tangibly embodied in an information carrier. The computer program product contains instructions that, when executed, perform one or more methods, such as those described above. The computer program product can be a computer- or machine-readable medium, such as the memory 1164, the expansion memory 1174, or memory on the processor 1152. In some implementations, the computer program product can be received in a propagated signal, for example, over the transceiver 1168 or the external interface 1162.

The mobile computing device 1150 can communicate wirelessly through the communication interface 1166, which can include digital signal processing circuitry where necessary. The communication interface 1166 can provide for communications under various modes or protocols, such as GSM voice calls (Global System for Mobile communications), SMS (Short Message Service), EMS (Enhanced Messaging Service), or MMS messaging (Multimedia Messaging Service), CDMA (code division multiple access), TDMA (time division multiple access), PDC (Personal Digital Cellular), WCDMA (Wideband Code Division Multiple Access), CDMA2000, or GPRS (General Packet Radio Service), among others. Such communication can occur, for example, through the transceiver 1168 using a radio-frequency. In addition, short-range communication can occur, such as using a Bluetooth, WiFi, or other such transceiver (not shown). In addition, a GPS (Global Positioning System) receiver module 1170 can provide additional navigation- and location-related wireless data to the mobile computing device 1150, which can be used as appropriate by applications running on the mobile computing device 1150.

The mobile computing device 1150 can also communicate audibly using an audio codec 1160, which can receive spoken information from a user and convert it to usable digital information. The audio codec 1160 can likewise generate audible sound for a user, such as through a speaker, e.g., in a handset of the mobile computing device 1150. Such sound can include sound from voice telephone calls, can include recorded sound (e.g., voice messages, music files, etc.) and can also include sound generated by applications operating on the mobile computing device 1150.

The mobile computing device 1150 can be implemented in a number of different forms, as shown in the figure. For example, it can be implemented as a cellular telephone 1180. It can also be implemented as part of a smart-phone 1182, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms machine-readable medium and computer-readable medium refer to any computer program product, apparatus and/or device (e.g., magnetic discs, optical disks, memory, Programmable Logic Devices (PLDs)) used to provide machine instructions and/ or data to a programmable processor, including a machine-readable medium that receives machine instructions as a machine-readable signal. The term machine-readable signal refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of the disclosed technology or of what may be claimed, but rather as descriptions of features that may be specific to particular embodiments of particular disclosed technologies. Certain features that are described in this specification in the context of separate embodiments can also be implemented in combination in a single embodiment in part or in whole. Conversely, various features that are described in the context of a single embodiment can also be implemented in multiple embodiments separately or in any suitable subcombination. Moreover, although features may be described herein as acting in certain combinations and/or initially claimed as such, one or more features from a claimed combination can in some cases be excised from the combination, and the claimed combination may be directed to a subcombination or variation of a subcombination. Similarly, while operations may be described in a particular order, this should not be understood as requiring that such operations be performed in the particular order or in sequential order, or that all operations be performed, to achieve desirable results. Particular embodiments of the subject matter have been described. Other embodiments are within the scope of the following claims.

What is claimed is:

1. A method for determining a pick area arrangement for a storage facility, the method comprising:
   retrieving, by a computer system from a data store, (i) historic pallet information for a plurality of pallet SKUs and (ii) pick area information, wherein the historic pallet information includes, for each of the pallet SKUs, an average daily pallet pick, a maximum daily pallet pick, and a weight per pallet, and the pick area information includes a current layout of the pick area;
   determining, by the computer system and based on the historic pallet information, a number of bays to allocate for each of the pallet SKUs;
   determining, by the computer system and based on the historic pallet information and the pick area information, a number of dynamic bays to allocate in the pick area, wherein the dynamic bays are configured to receive pallet SKUs that are in high demand during a particular time period;
   determining, by the computer system and based on historic pallet information and the pick area information, one or more quantities of aisles to allocate as pick aisles in the pick area, wherein determining the quantities of aisles to allocate is based on simulating one or more aisle arrangements with pallet SKUs from the historic pallet information and determining average travel times to complete pick orders having the pallet SKUs in each of the one or more aisle arrangements;
   selecting, by the computer system, the quantity of aisles that provides a lowest average travel time;
   assigning, by the computer system, each of the pallet SKUs from the historic pallet information to bays in the selected quantity of aisles in the pick area based on the determined number of bays allocated for each of the pallet SKUs, the determined number of dynamic bays allocated in the pick area, the average daily pallet pick for each of the pallet SKUs, and the weight per pallet of each of the pallet SKUs;
   outputting, by the computer system, pick area arrangement information for modifying the pick area for the storage facility, wherein the pick area arrangement information includes at least one of the quantity of aisles that provides the lowest average travel time, the assignments of each of the pallet SKUs to the bays in the selected quantity of aisles, the determined number of bays allocated for each of the pallet SKUs, and the determined number of dynamic bays allocated in the pick area; and
   returning instructions that, when executed, cause automated vehicles in the storage facility to automatically move pallets corresponding to the assignments of each of the pallet SKUs from a docking bay in the storage facility into the determined number of bays in the selected quantity of aisles.

2. The method of claim 1, wherein determining, by the computer system and based on the historic pallet information, a number of bays to allocate for each of the pallet SKUs comprises:
   ranking, based on the historic pallet information, a number of pallets picked per day into a historic spread for the pallet SKU;
   retrieving, from a data store, a threshold number of days that is acceptable for a mid shift drop of any pallet SKU in the historic pallet information;
   comparing the threshold number of days to the historic spread for the pallet SKU; and
   selecting the number of bays to allocate based on the comparison of the threshold number of days to the historic spread for the pallet SKU.

3. The method of claim 2, wherein the threshold number of days that is acceptable for a mid shift drop of any pallet SKU is 15 days.

4. The method of claim 2, wherein the selected number of bays to allocate is greater than the average daily pallet pick and less than the maximum daily pallet pick for the pallet SKU.

5. The method of claim 1, wherein assigning, by the computer system, each of the pallet SKUs from the historic pallet information to bays in the selected quantity of aisles in the pick area comprises:
   identifying a velocity of each of the pallet SKUs, wherein the velocity is a frequency at which each of the pallet SKUs is picked on a daily basis;
   ranking, into a list, the pallet SKUs from highest to lowest velocity;
   selecting a first pallet SKU having a same velocity as a second pallet SKU;
   determining whether the weight per pallet of the first pallet SKU is less than the weight per pallet of the second pallet SKU;
   swapping rankings of the first pallet SKU and the second pallet SKU based on determining that the weight per pallet of the first pallet SKU is less than the weight per pallet of the second pallet SKU;
   keeping rankings of the first pallet SKU and the second pallet SKU based on determining that the weight per pallet of the first pallet SKU is more than the weight per pallet of the second pallet SKU;
   outputting the ranked list;
   assigning pallet SKUs at a top of the list to bays in the selected quantity of aisles that are closest to a front of the pick area; and
   assigning pallet SKUs at a bottom of the list to bays in the selected quantity of aisles that are farthest from the front of the pick area.

6. The method of claim 5, wherein the velocity is the average daily pallet pick for each of the pallet SKUs.

7. The method of claim 1, wherein assigning, by the computer system, each of the pallet SKUs from the historic pallet information to bays in the selected quantity of aisles in the pick area further comprises determining whether to group the bays for each of the pallet SKUs.

8. The method of claim 7, wherein determining, by the computer system, whether to group the bays for each of the pallet SKUs comprises:
   identifying the number of bays to allocate for the pallet SKU;
   determining a number of days that each of the number of bays would be picked;
   determining a probability of getting picked per SKU based on the number of bays allocated and the number of days the bays would be picked; and
   grouping the number of bays based on determining that the probability of a next pallet of the pallet SKU getting picked is within a threshold range.

9. The method of claim 8, further comprising separating the number of bays based on determining that the probability of the next pallet of the pallet SKU getting picked exceeds the threshold range.

10. The method of claim 8, wherein the probability of getting picked per SKU is a percentage value and the threshold range is 10%.

11. The method of claim 1, wherein determining, by the computer system and based on the historic pallet information, a number of dynamic bays to allocate in the pick area comprises:
   randomly determining one or more quantities of dynamic bays to allocate in the pick area;
   for each of the quantities of dynamic bays, interspersing the number of dynamic bays throughout the pick area in one or more pick area arrangements;
   receiving (i) a list of pallet SKUs that can be placed in the number of dynamic bays and (ii) a picking order for the list of pallet SKUs;
   simulating placement, based on (ii), of the pallet SKUs from the list into one or more of the number of dynamic bays in the pick area arrangements;
   simulating distance traveled to complete the picking order for the list of pallet SKUs in each of the pick area arrangements;
   determining a number of pallets to build to complete the picking order for the list of pallet SKUs in each of the pick area arrangements;
   determining an aggregate amount of time to complete the picking order for the list of pallet SKUs for each of the pick area arrangements based on the simulated distance traveled and the determined number of pallets to build;
   selecting the pick area arrangement having a lowest aggregate amount of time to complete the picking order for the list of pallet SKUs; and
   returning the number of dynamic bays associated with the selected pick area arrangement.

12. The method of claim 1, wherein determining, by the computer system and based on historic pallet information and the pick area information, one or more quantities of aisles to allocate as pick aisles in the pick area further comprises:
   determining one or more aisle arrangements having different quantities of aisles;
   assigning pallet SKUs from the historic pallet information to bays in each of the aisle arrangements, wherein the assignments are made based on velocity;
   receiving pick sequences for one or more pick orders;
   simulating distance traveled to complete the pick sequences for the one or more pick orders in each of the aisle arrangements;
   determining a number of pallets to build to complete the pick sequences for the one or more pick orders in each of the aisle arrangements;
   determining an aggregate amount of time to complete the one or more pick orders based on the simulated distance traveled and the determined number of pallets to build;
   selecting the aisle arrangement having a lowest aggregate amount of time to complete the one or more pick orders; and
   returning the selected aisle arrangement.

13. A system for determining a pick area arrangement for a storage facility, the system comprising:
   a pick area comprising a plurality of bays; and
   a computer system configured to:
      retrieve, from a data store, (i) historic pallet information for a plurality of pallet SKUs and (ii) pick area information, wherein the historic pallet information includes, for each of the pallet SKUs, an average daily pallet pick, a maximum daily pallet pick, and a weight per pallet, and the pick area information includes a current layout of the pick area;
      determine, based on the historic pallet information, a number of bays to allocate for each of the pallet SKUs in the pick area;
      determine, based on the historic pallet information and the pick area information, a number of dynamic bays to allocate in the pick area, wherein the dynamic bays are configured to receive pallet SKUs that are in high demand during a particular time period;

determine, based on historic pallet information and the pick area information, one or more quantities of aisles to allocate as pick aisles in the pick area, wherein determining the quantities of aisles to allocate is based on simulating one or more aisle arrangements with pallet SKUs from the historic pallet information and determining average travel times to complete pick orders having the pallet SKUs in each of the one or more aisle arrangements;

select the quantity of aisles that provides a lowest average travel time;

assign each of the pallet SKUs from the historic pallet information to bays in the selected quantity of aisles in the pick area based on the determined number of bays allocated for each of the pallet SKUs, the determined number of dynamic bays allocated in the pick area, the average daily pallet pick for each of the pallet SKUs, and the weight per pallet of each of the pallet SKUs;

output pick area arrangement information, wherein the pick area arrangement information for modifying the pick area for the storage facility, wherein the pick area information includes at least one of the quantity of aisles that provides the lowest average travel time, the assignments of each of the pallet SKUs to the bays in the selected quantity of aisles, the determined number of bays allocated for each of the pallet SKUs, and the determined number of dynamic bays allocated in the pick area; and return instructions that, when executed, cause automated vehicles in the storage facility to automatically move pallets corresponding to the assignments of each of the pallet SKUs from a docking bay in the storage facility into the determined number of bays in the selected quantity of aisles.

14. The system of claim 13, wherein the computer system is configured to determine, based on the historic pallet information, a number of bays to allocate for each of the pallet SKUs further based on:

ranking, based on the historic pallet information, a number of pallets picked per day into a historic spread for the pallet SKU;

retrieving, from a data store, a threshold number of days that is acceptable for a mid shift drop of any pallet SKU in the historic pallet information;

comparing the threshold number of days to the historic spread for the pallet SKU; and selecting the number of bays to allocate based on the comparison of the threshold number of days to the historic spread for the pallet SKU.

15. The system of claim 14, wherein the threshold number of days that is acceptable for a mid shift drop of any pallet SKU is 15 days.

16. The system of claim 14, wherein the selected number of bays to allocate is greater than the average daily pallet pick and less than the maximum daily pallet pick for the pallet SKU.

17. The system of claim 1, wherein the computer system is configured to assign each of the pallet SKUs from the historic pallet information to bays in the selected quantity of aisles in the pick area based on:

identifying a velocity of each of the pallet SKUs, wherein the velocity is a frequency at which each of the pallet SKUs is picked on a daily basis;

ranking, into a list, the pallet SKUs from highest to lowest velocity;

selecting a first pallet SKU having a same velocity as a second pallet SKU;

determining whether the weight per pallet of the first pallet SKU is less than the weight per pallet of the second pallet SKU;

swapping rankings of the first pallet SKU and the second pallet SKU based on determining that the weight per pallet of the first pallet SKU is less than the weight per pallet of the second pallet SKU;

keeping rankings of the first pallet SKU and the second pallet SKU based on determining that the weight per pallet of the first pallet SKU is more than the weight per pallet of the second pallet SKU;

outputting the ranked list;

assigning pallet SKUs at a top of the list to bays in the selected quantity of aisles that are closest to a front of the pick area; and assigning pallet SKUs at a bottom of the list to bays in the selected quantity of aisles that are farthest from the front of the pick area.

18. The system of claim 13, wherein the velocity is the average daily pallet pick for each of the pallet SKUs.

19. The system of claim 13, wherein the computer system is configured to assign each of the pallet SKUs from the historic pallet information to bays in the selected quantity of aisles in the pick area based on determining whether to group the bays for each of the pallet SKUs.

20. The system of claim 19, wherein the computer system is configured to determine whether to group the bays for each of the pallet SKUs based on:

identifying the number of bays to allocate for the pallet SKU;

determining a number of days that each of the number of bays would be picked;

determining a probability of getting picked per SKU based on the number of bays allocated and the number of days the bays would be picked; and grouping the number of bays based on determining that the probability of a next pallet of the pallet SKU getting picked is within a threshold range.

* * * * *